US012562731B2

(12) United States Patent
Chuang

(10) Patent No.: US 12,562,731 B2
(45) Date of Patent: Feb. 24, 2026

(54) DRIVING CIRCUIT FOR DRIVING EITHER VOLTAGE-DRIVEN OR CURRENT-DRIVEN SWITCH

(71) Applicant: Ancora Semiconductors Inc., Taoyuan (TW)

(72) Inventor: Po-Chin Chuang, Taoyuan (TW)

(73) Assignee: ANCORA SEMICONDUCTORS INC., Taoyuan (TW)

( * ) Notice: Subject to any disclaimer, the term of this patent is extended or adjusted under 35 U.S.C. 154(b) by 137 days.

(21) Appl. No.: 18/400,504

(22) Filed: Dec. 29, 2023

(65) Prior Publication Data

US 2024/0250682 A1 Jul. 25, 2024

Related U.S. Application Data

(60) Provisional application No. 63/439,988, filed on Jan. 19, 2023.

(51) Int. Cl.
*H03K 17/567* (2006.01)
*H03K 17/06* (2006.01)
*H03K 17/16* (2006.01)

(52) U.S. Cl.
CPC ........... *H03K 17/567* (2013.01); *H03K 17/06* (2013.01); *H03K 17/168* (2013.01)

(58) Field of Classification Search
CPC ..... H03K 17/567; H03K 17/06; H03K 17/168
See application file for complete search history.

(56) References Cited

U.S. PATENT DOCUMENTS

| | | | |
|---|---|---|---|
| 8,558,587 B2 | 10/2013 | Machida et al. | |
| 11,309,887 B2 * | 4/2022 | Chao ..................... | H03K 17/06 |
| 11,456,737 B2 * | 9/2022 | Chuang ................. | H02H 3/087 |
| 2004/0189268 A1 | 9/2004 | Li et al. | |
| 2009/0066402 A1 | 3/2009 | Hiyama | |
| 2011/0221480 A1 | 9/2011 | Ikeda | |
| 2021/0105010 A1 * | 4/2021 | Chao .................... | H03K 17/163 |
| 2021/0226621 A1 * | 7/2021 | Chuang ................. | H02H 3/087 |
| 2022/0416641 A1 | 12/2022 | Yeh et al. | |
| 2022/0416645 A1 * | 12/2022 | Chuang ............... | H03K 17/163 |

FOREIGN PATENT DOCUMENTS

JP 2000349608 A * 12/2000

OTHER PUBLICATIONS

The Office Communication and Search Report of its corresponding TW application No. 113102106 dated Nov. 27, 2024; pp. 1-6.

* cited by examiner

*Primary Examiner* — Metasebia T Retebo
(74) *Attorney, Agent, or Firm* — MUNCY, GEISSLER, OLDS & LOWE, P.C.

(57) ABSTRACT

An electronic circuit includes a driving circuit and a power switch. The driving circuit includes a first control circuit and a second control circuit. The first control circuit is coupled between a high-level voltage and an internal node. The second control circuit includes a first switch and a second switch. The first switch is coupled between the internal node and a driving node, and the second switch is coupled between the driving node and a first low-level voltage. The second control circuit periodically couples the first control circuit and the first low-level voltage to a driving node. The power switch is coupled to a second low-level voltage and turned on or off in response to a driving signal at the driving node. The power switch is either current-driven or voltage-driven.

30 Claims, 16 Drawing Sheets

500

400

1400

1300

1200

1100

1000

1700

1600

1500

2000

1900

1800

2300

2200

2100

DRIVING CIRCUIT FOR DRIVING EITHER VOLTAGE-DRIVEN OR CURRENT-DRIVEN SWITCH

CROSS REFERENCE TO RELATED APPLICATIONS

This application claims the benefit of U.S. Provisional Application No. 63/439,988, filed on Jan. 19, 2023, the entirety of which is incorporated by reference herein.

BACKGROUND OF THE INVENTION

Field of the Invention

The disclosure is generally related to driving circuit that is able to drive either a voltage-driven or a current-driven switch.

Description of the Related Art

With the development of technology, many types of switches have been developed. Those transistors may be divided into two categories: current-driven switches and voltage-driven switches. Since current-driven switches and voltage-driven switches are driven by current and voltage, respectively, it is difficult to drive these two types of switches with an identical driving circuit.

FIG. 1 illustrates a schematic diagram of a current-driven transistor. As shown in FIG. 1, the current-driven transistor 100 includes a parasitic diode DP, where the parasitic diode DP is coupled between the first gate terminal G1 and the first source terminal S1 of the current-driven transistor 100. When the current-driven transistor 100 is turned on, a gate current IG is required to forward-biased the parasitic diode DP to generate a turn-on voltage VON across the first gate terminal G1 to the first source terminal S1.

FIG. 2 illustrates a schematic diagram of a voltage-driven transistor. As shown in FIG. 2, when the voltage-driven transistor 200 is turned on, a bias voltage VB is applied across the second gate terminal G2 and the second source terminal S2 of the voltage-driven transistor 200. Comparing the current-driven transistor 100 and the voltage-driven transistor 200, the current-driven transistor 100 needs the gate current IG and the turn-on voltage VON to be turned on, while the voltage-driven transistor 200 only needs the bias voltage VB to be turned on.

With the increasing popularity of switching circuits, driving circuits for driving switches become more significant. Once a driving circuit for driving both a current-driven switch and a voltage-driven switch is proposed, it would be really convenient for engineers to freely utilize a current-driven switch or a voltage-driven switch in their designs.

BRIEF SUMMARY OF THE INVENTION

Driving circuits that are able to drive a current-driven switch and a voltage-driven switch are proposed herein. The proposed driving circuits are able to set the proper voltage at the gate terminal to keep the voltage-driven switch on, and they also provide a fixed current to keep the current-driven switch on. It makes it more convenient for engineers to be able to freely utilize a current-driven switch or a voltage-driven switch in their designs.

In an embodiment, an electronic circuit is proposed, which comprises a driving circuit and a power switch. The driving circuit comprises a first control circuit and a second control circuit. The first control circuit is coupled between a high-level voltage and an internal node. The second control circuit comprises a first switch and a second switch, wherein the first switch is coupled between the internal node and a driving node, and the second switch is coupled between the driving node and a first low-level voltage. The second control circuit periodically couples the first control circuit and the first low-level voltage to a driving node. The power switch is coupled to a second low-level voltage and turned on or off in response to a driving signal at the driving node. The power switch is either current-driven or voltage-driven.

According to an embodiment of the preset disclosure, the first low-level voltage is equal to the second low-level voltage.

According to another embodiment of the preset disclosure, the first low-level voltage is not equal to the second low-level voltage.

According to an embodiment of the preset disclosure, the first control circuit comprises a current source. The current source is coupled between the high-level voltage and the internal node and generating a fixed current.

According to an embodiment of the preset disclosure, the current source comprises a first resistor, a reference generator, a second resistor, and an NPN transistor. The first resistor is coupled between the high-level voltage and a first node and generates first current. The reference generator generates a reference voltage at a second node based on the first current. The second resistor is coupled between the second node and the internal node and generates a second current with the reference voltage. The NPN transistor comprises a collector, a base, and an emitter, where the collector is coupled to the high-level voltage, the base is coupled to the first node, and the emitter is coupled to the second node. The fixed current is equal to a sum of the first current and the second current.

According to another embodiment of the preset disclosure, the current source comprises a normally-on transistor and a first resistor. The normally-on transistor comprises a drain terminal, a gate terminal, and a source terminal, where the drain terminal is coupled to the high-level voltage and the gate terminal is coupled to the internal node. The first resistor is coupled between the source terminal and the internal node. The fixed current is generated based on the first resistor and a voltage across the source terminal and the gate terminal.

According to an embodiment of the preset disclosure, the first control circuit further comprises a capacitor. The capacitor is coupled between the high-level voltage and the internal node.

According to another embodiment of the preset disclosure, the first control circuit further comprises a diode. The diode comprises an anode and a cathode, where the anode is coupled to the internal node and the cathode is coupled to the high-level voltage.

According to an embodiment of the preset disclosure, the driving circuit further comprises a dividing circuit comprising a first dividing resistor and a second dividing resistor. The first dividing resistor is coupled between the high-level voltage and the internal node. The second dividing resistor is coupled between the driving node and the second low-level voltage. The dividing circuit is configured to determine a voltage of the driving node.

According to an embodiment of the preset disclosure, the driving circuit further comprises a voltage clamp unit. The voltage clamp unit is coupled between the driving node and the second low-level voltage. The voltage clamp unit is configured to clamp a voltage between the driving node and the second low-level voltage.

According to an embodiment of the preset disclosure, the voltage clamp unit comprises a Zener diode. The Zener diode comprises a anode and a cathode. The anode is coupled to the second low-level voltage, and the cathode is coupled to the driving node.

According to another embodiment of the preset disclosure, the voltage clamp unit comprises a Zener diode comprising a anode and a cathode. The anode is coupled to the driving node, and the cathode is coupled to the second low-level voltage.

According to yet another embodiment of the preset disclosure, the voltage clamp unit comprises a first Zener diode comprising a first anode and a first cathode and a second Zener diode comprising a second anode and a second cathode. The first anode is coupled to the second anode. The first cathode is coupled to the driving node. The second cathode is coupled to the second low-level voltage.

According to yet another embodiment of the preset disclosure, the voltage clamp unit comprises a diode comprising a first anode and a first cathode and a Zener diode comprising a second anode and a second cathode. The first anode is coupled to the driving node. The first cathode is coupled to the second cathode. The second anode is coupled to the second low-level voltage.

According to yet another embodiment of the preset disclosure, the voltage clamp unit comprises a Zener diode comprising a first anode and a first cathode and a diode comprising a second anode and a second cathode. The first anode is coupled to the driving node. The first cathode is coupled to the second cathode. The second anode is coupled to the second low-level voltage.

According to yet another embodiment of the preset disclosure, the voltage clamp unit comprises a first diode comprising a first anode and a first cathode and a second diode comprising a second anode and a second cathode. The first anode is coupled to the driving node. The first cathode is coupled to the second anode. The second cathode is coupled to the second low-level voltage.

According to yet another embodiment of the preset disclosure, the voltage clamp unit comprises a first diode comprising a first anode and a first cathode, a second diode, comprising a second anode and a second cathode, and a third diode comprising a third anode and a third cathode. The first anode is coupled to the driving node. The first cathode is coupled to the second anode. The second cathode is coupled to the second low-level voltage. The third anode is coupled to the second low-level voltage. The third cathode is coupled to the driving node.

According to yet another embodiment of the preset disclosure, the voltage clamp unit comprises a first diode comprising a first anode and a first cathode. The first anode is coupled to the second low-level voltage. The first cathode is coupled to the driving node.

According to yet another embodiment of the preset disclosure, the voltage clamp unit comprises a first diode comprising a first anode and a first cathode. The first anode is coupled to the driving node. The first cathode is coupled to the second low-level voltage.

According to yet another embodiment of the preset disclosure, the voltage clamp unit comprises a first diode comprising a first anode and a first cathode and a second diode comprising a second anode and a second cathode. The first anode is coupled to the second low-level voltage. The first cathode is coupled to the driving node. The second anode is coupled to the driving node. The second cathode is coupled to the second low-level voltage.

According to yet another embodiment of the preset disclosure, the voltage clamp unit comprises a first N-type transistor comprising a first drain terminal, a first gate terminal, a first source terminal, and a first base terminal and a second N-type transistor comprising a second drain terminal, a second gate terminal, a second source terminal, and a second base terminal. The first source terminal is coupled to the first gate terminal, the first base terminal, and the driving node. The first drain terminal is coupled to the second source terminal, the second gate terminal, and the second base terminal. The second drain terminal is coupled to the second low-level voltage.

According to yet another embodiment of the preset disclosure, the voltage clamp unit comprises a first N-type transistor comprising a first drain terminal, a first gate terminal, a first source terminal, and a first base terminal, a second N-type transistor comprising a second drain terminal, a second gate terminal, a second source terminal, and a second base terminal, and a third N-type transistor comprising a third drain terminal, a third gate terminal, a third source terminal, and a third base terminal. The first source terminal is coupled to the first gate terminal, the first base terminal, the driving node, and the third drain terminal. The first drain terminal is coupled to the second source terminal, the second gate terminal, and the second base terminal. The second drain terminal is coupled to the second low-level voltage, the third source terminal, the third gate terminal, and the third base terminal.

According to yet another embodiment of the preset disclosure, the voltage clamp unit comprises a first N-type transistor comprising a first drain terminal, a first gate terminal, a first source terminal, and a first base terminal. The first source terminal is coupled to the first gate terminal, the first base terminal, and the second low-level voltage. The first drain terminal is coupled to the driving node.

According to yet another embodiment of the preset disclosure, the voltage clamp unit comprises a first N-type transistor comprising a first drain terminal, a first gate terminal, a first source terminal, and a first base terminal. The first source terminal is coupled to the first gate terminal, the first base terminal, and the driving node. The first drain terminal is coupled to the second low-level voltage.

According to another embodiment of the preset disclosure, the driving circuit further comprises a voltage-controlled switch comprising a first terminal, a second terminal, and a control terminal. The first terminal is coupled to the driving node. The second terminal is coupled to a gate terminal of the power switch. The voltage clamp unit is coupled between the control node and the second low-level voltage.

According to an embodiment of the preset disclosure, when the first switch is turned on, the high-level voltage is provided to the control terminal of the voltage-controlled switch through a parasitic capacitance between the first terminal and the control terminal. The voltage-controlled switch is turned on or off in response to a voltage of the control terminal.

According to an embodiment of the preset disclosure, the voltage-controlled switch comprises a normally-on transistor comprising the first terminal, the second terminal, and the control terminal. When a voltage of the control terminal to the second terminal is less than a threshold of the normally-on transistor, the normally-on transistor is turned off so as to set a voltage of the gate terminal of the power switch. A voltage of the control terminal is determined by the voltage clamp unit.

According to another embodiment of the preset disclosure, the voltage-controlled switch comprises a normally-off transistor comprising the first terminal, the second terminal, and the control terminal. When a voltage of the control terminal to the second terminal is less than a threshold of the normally-off transistor, the normally-off transistor is turned off so as to set a voltage of the gate terminal of the power switch. A voltage of the control terminal is determined by the voltage clamp unit.

According to yet another embodiment of the preset disclosure, the voltage-controlled switch comprises an NPN transistor comprising a collector, a base, and an emitter. The collector corresponds to the first terminal, the base corresponds to the control terminal, and the emitter corresponds to the second terminal. When a voltage of the base to the emitter is less than a cut-off voltage of the NPN transistor, the NPN transistor is turned off so as to set a voltage of the gate terminal of the power switch. A voltage of the control terminal is determined by the voltage clamp unit.

According to yet another embodiment of the preset disclosure, the voltage-controlled circuit comprises a feed-through resistor. The feedthrough resistor is coupled between the gate terminal of the power switch and the control terminal.

According to an embodiment of the preset disclosure, a voltage of the gate terminal of the power switch is equal to a sum of a voltage across the feedthrough resistor and a voltage of the control terminal.

According to yet another embodiment of the preset disclosure, the driving circuit further comprises a damping circuit. The damping circuit is coupled between the driving node and a gate terminal of the power switch. The damping circuit is configured to prevent oscillation at the gate terminal of the power switch.

According to an embodiment of the preset disclosure, the damping circuit comprises a first damping resistor and a diode. The first damping resistor is coupled between the driving node and the gate terminal of the power switch. The diode comprises an anode and a cathode. The anode is coupled to the gate terminal of the power switch and the cathode is coupled to the driving node.

According to another embodiment of the preset disclosure, the damping circuit comprises a second damping resistor. The second damping resistor is coupled between the cathode and the driving node.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 2:
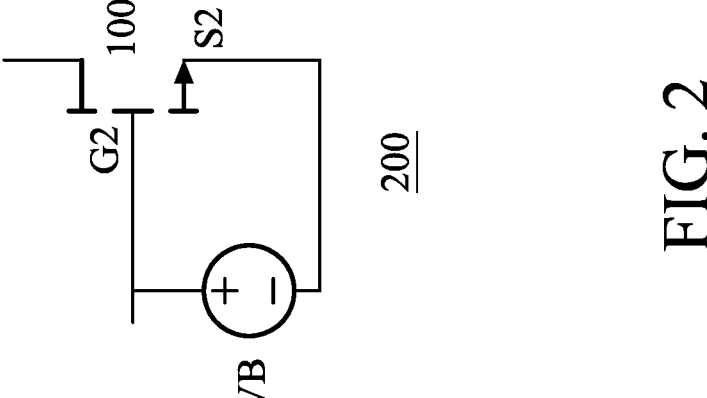
FIG. 2 illustrates a schematic diagram of a voltage-driven transistor.
Figure 1:
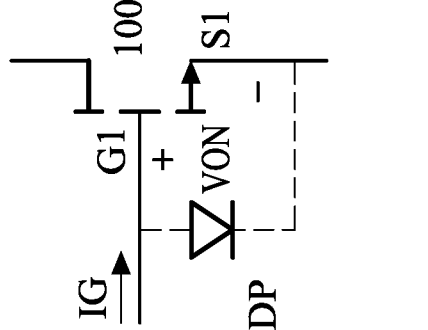
FIG. 1 illustrates a schematic diagram of a current-driven transistor.

The following description is made for the purpose of illustrating the general principles of the disclosure and should not be taken in a limiting sense. The scope of the disclosure is determined by reference to the appended claims.

In the following detailed description, for purposes of explanation, numerous specific details and embodiments are set forth in order to provide a thorough understanding of the present disclosure. The use of like and/or corresponding numerals in the drawings of different embodiments does not suggest any correlation between different embodiments.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

In addition, in this specification, relative spatial expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section in the specification could be termed a second element, component, region, layer, portion or section in the claims without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "approximately", "about" and "substantially" typically mean a value is within a range of +/−20% of the stated value, more typically a range of +/−10%, +/−5%, +/−3%, +/−2%, +/−1% or +/−0.5% of the stated value. The stated value of the present disclosure is an approximate value. Even there is no specific description, the stated value still includes the meaning of "approximately", "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

In the drawings, similar elements and/or features may have the same reference number. Various components of the same type can be distinguished by adding letters or numbers after the component symbol to distinguish similar components and/or similar features.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

Figure 3:
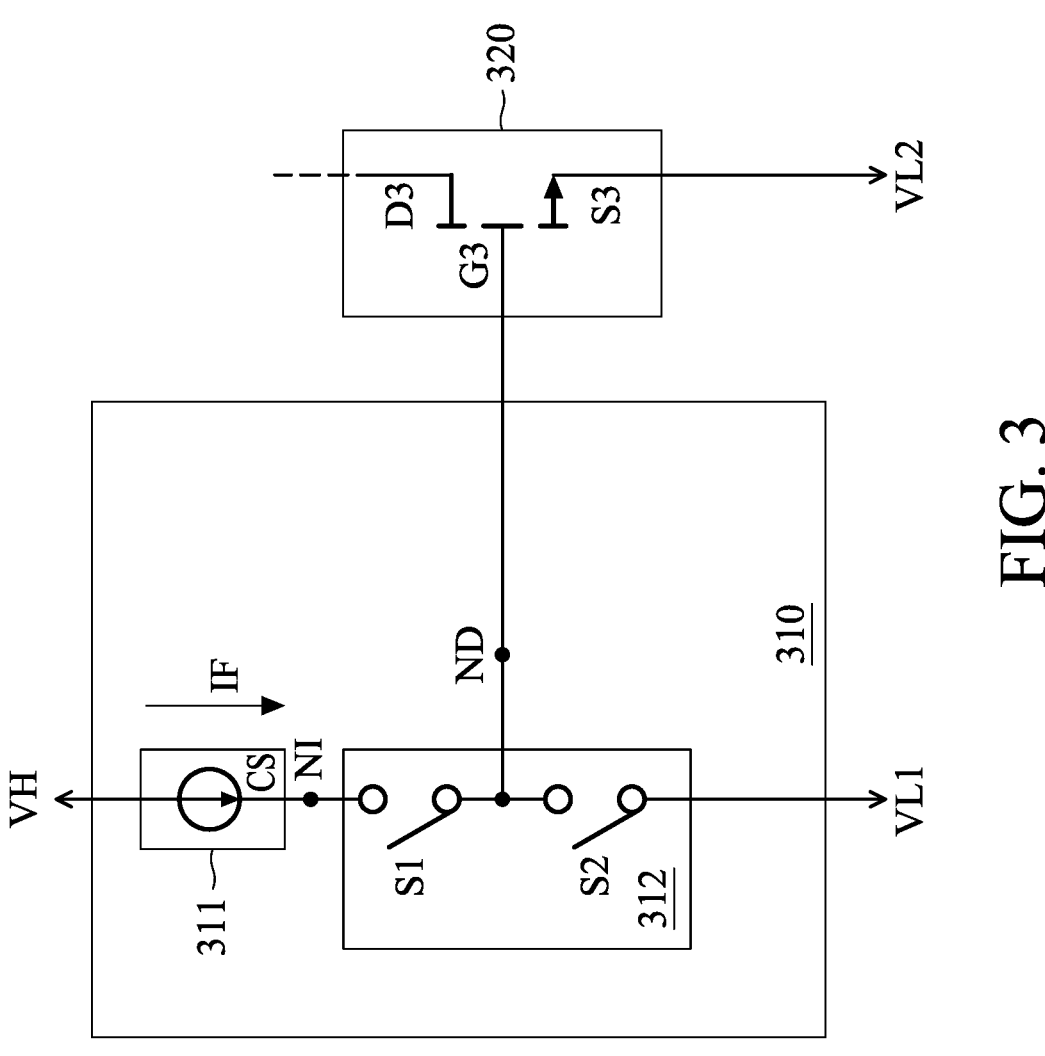
FIG. 3 is a block diagram of an electronic circuit in accordance with an embodiment of the present disclosure.

FIG. 3 is a block diagram of an electronic circuit in accordance with an embodiment of the present disclosure. As shown in FIG. 3, the electronic circuit 300 includes a driving circuit 310 and a power switch 320. The driving circuit 310 includes a first control circuit 311 and a second control circuit 312.

The first control circuit 311 is coupled between the high-level voltage VH and an internal node NI and includes a current source CS. The second control circuit 312 includes a first switch S1 and a second switch S2. The first switch S1 is coupled between the internal node NI and a driving node ND. The second switch S2 is coupled between the driving node ND and a first low-level voltage VL1.

The power switch 320 includes a third gate terminal G3, a third source terminal S3, and a third drain terminal D3. The third gate terminal G3 is coupled to the driving node ND, and the third source terminal S3 is coupled to a second low-level voltage VL2. The third drain terminal D3 receives operating voltage and current from other circuits. According to some embodiments of the present disclosure, the first low-level voltage VL1 may be identical to the second low-level voltage VL2. According to other embodiments of the present disclosure, the first low-level voltage VL1 may be different from the second low-level voltage VL2.

According to other embodiments of the present disclosure, the first low-level voltage VL1 may be less than the second low-level voltage VL2. In other words, when the second low-level voltage VL2 is 0V, the first low-level voltage VL1 is negative voltage.

The power switch 320, which employs a material such as silicon, silicon carbide (SiC), gallium nitride (GaN), gallium arsenide (GaAs), compound semiconductor or diamond, exhibits excellent characteristics as a switching element. Examples of such a semiconductor element herein are as follows: Metal-Oxide-Semiconductor Field-Effect (MOS-FET), Junction FET (JFET), Static Induction Transistor (SIT), Metal-Semiconductor Field Effect Transistor (MESFET), Heterojunction Field Effect Transistor (HFET), Metal Insulator Semiconductor Field Effect Transistor (MISFET), High Electron Mobility Transistor (HEMT), Gate Injection Transistor (GIT), and so on.

According to an embodiment of the present disclosure, the power switch 320 may be a current-driven switch. According to another embodiment of the invention, the power switch 320 may be a voltage-driven switch. According to some embodiments of the present disclosure, the first control circuit 311 may be a current source for providing a fixed current IF to keep the power switch 320 turned on when the power switch 320 is a current-driven switch. According to other embodiments of the present disclosure, the first control circuit 311 generates a voltage of the internal node NI to keep the power switch 320 turned on when the power switch 320 is a voltage-driven switch.

According to some embodiments of the present disclosure, the first control circuit 311 and the second control circuit 312 of the driving circuit 310 may be integrated or packaged together. According to an embodiment of the present disclosure, the first control circuit 311 and the second control circuit 312 of the driving circuit 310 may be integrated using System on Chip (SoC) technology. According to another embodiment of the present disclosure, the first control circuit 311 and the second control circuit 312 of the driving circuit 310 may be packaged using System in Package (SiP) technology. According to another embodiment of the present disclosure, the first control circuit 311 and the second control circuit 312 of the driving circuit 310 may be packaged in a 3-dimensional package.

Figure 4:
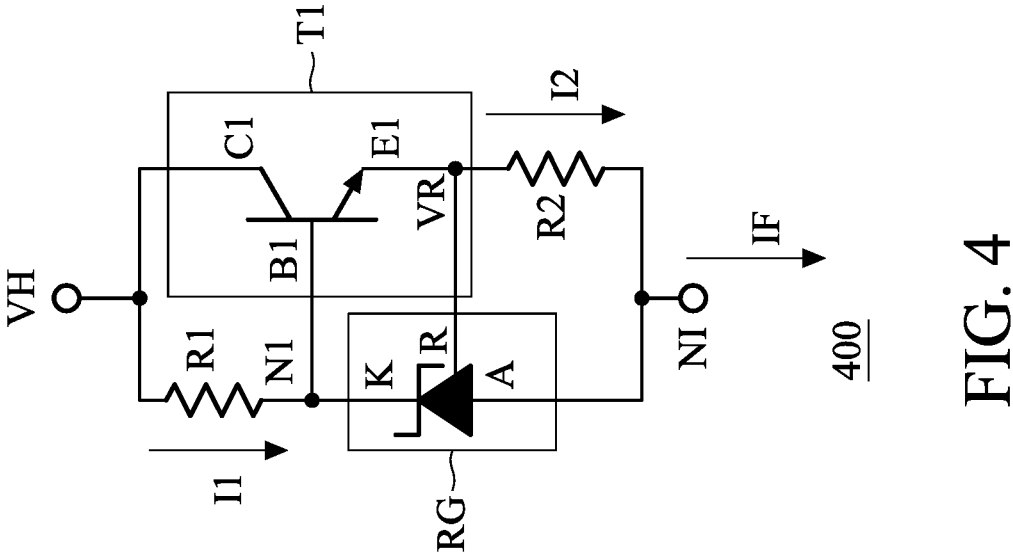
FIG. 4 is a schematic diagram of a current source in accordance with an embodiment of the present disclosure.

FIG. 4 is a schematic diagram of a current source in accordance with an embodiment of the present disclosure. As shown in FIG. 4, the current source 400 includes a first resistor R1, a reference generator RG, a second resistor R2, and an NPN transistor T1.

The first resistor R1 is coupled between the high-level voltage VH and a first node N1 and generates a first current I1. The reference generator RG includes an anode A, a cathode K, and a reference node R, where the anode A is coupled to the internal node NI, the cathode K is coupled to the first node N1. According to an embodiment of the present disclosure, when the first current I1 flows through the reference generator RG, a reference voltage VR is generated at the reference node R.

The second resistor R2 is coupled between the reference node R and the internal node NI, and generates a second current I2 with the reference voltage VR. According to some embodiments of the present disclosure, the second current I2 exceeds the first current I1. The NPN transistor T1 includes a first collector C1, a first base B1, and a first emitter E1, where the first collector C1 is coupled to the high-level voltage VH, the first base B1 is coupled to the first node N1, and the first emitter E1 is coupled to the reference node R.

According to an embodiment of the present disclosure, the current source 400 is configured to generate a fixed current IF to the internal node NI, where the fixed current IF is equal to the sum of the first current I1 and the second current I2. According to some embodiments of the present disclosure, the first current I1 is far less than the second current I2, so that the fixed current IF generated by the first control circuit 400 is very close to the second current I2.

According to an embodiment of the present disclosure, when the power switch 320 is a current-driven switch, the fixed current IF generated by the current source 400 is configured to keep the power switch 320 in FIG. 3 turned on. According to another embodiment of the present disclosure, when the power switch 320 in FIG. 3 is a voltage-driven switch, the voltage of the internal node NI is configured to keep the power switch 320 turned on.

Figure 5:
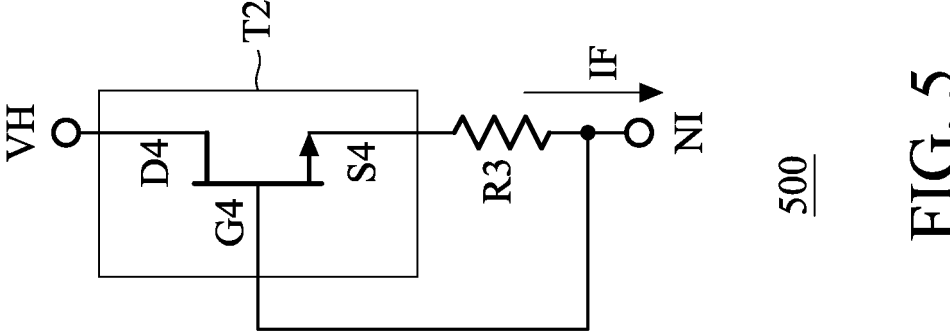
FIG. 5 is a schematic diagram of a current source in accordance with another embodiment of the present disclosure.

FIG. 5 is a schematic diagram of a current source in accordance with another embodiment of the present disclosure. As shown in FIG. 5, the current source 500 includes a normally-on transistor T2 and a third resistor R3.

The normally-on transistor T2 includes a fourth drain terminal D4, a fourth gate terminal G4, and a fourth source terminal S4, where the fourth drain terminal D4 is coupled to the high-level voltage VH and the fourth gate terminal G4 is coupled to the internal node NI. The third resistor R3 is coupled between the fourth source terminal S4 and the internal node NI.

According to an embodiment of the present disclosure, the current source 500 generates the fixed current IF based on the voltage across the fourth source terminal S4 and the fourth gate terminal G4 and the third resistor R3. According to some embodiments of the present disclosure, the normally-on transistor T2, which employs a material such as silicon, silicon carbide (SiC), gallium nitride (GaN), gallium arsenide (GaAs), compound semiconductor or diamond, exhibits excellent characteristics as a switching element. Examples of the normally-on transistor T2 are as follows: Metal-Oxide-Semiconductor Field-Effect (MOSFET), Junction FET (JFET), Static Induction Transistor (SIT), Metal-Semiconductor Field Effect Transistor (MESFET), Heterojunction Field Effect Transistor (HFET), Metal Insulator Semiconductor Field Effect Transistor (MISFET), High Electron Mobility Transistor (HEMT), Gate Injection Transistor (GIT), and so on.

Figure 6:
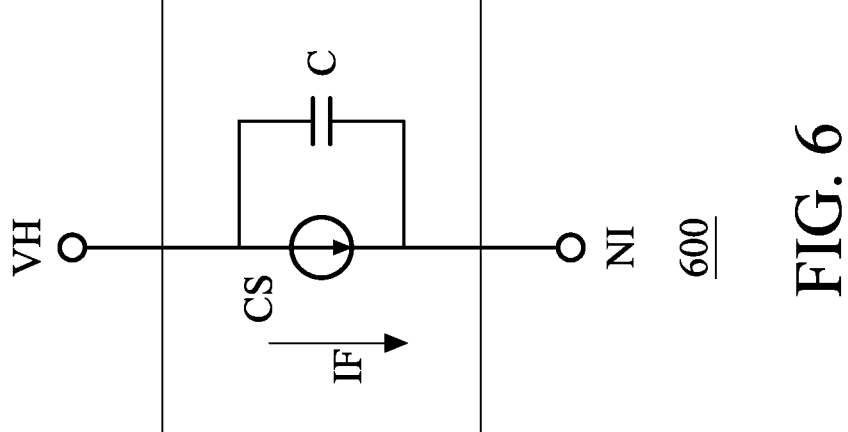
FIG. 6 is a schematic diagram of a first control circuit in accordance with another embodiment of the present disclosure.

FIG. 6 is a schematic diagram of a first control circuit in accordance with another embodiment of the present disclosure. As shown in FIG. 6, the first control circuit 600 includes a current source CS and a capacitor C. According to an embodiment of the present disclosure, the current source CS may correspond to the current source 400 in FIG. 4. According to another embodiment of the present disclosure, the current source CS may correspond to the current source 500 in FIG. 5. According to some embodiments of the present disclosure, the first control circuit 600 corresponds to the first control circuit 311 in FIG. 3. The capacitor C is coupled between the high-level voltage VH and the internal node NI.

According to some embodiments of the present disclosure, since the current source CS provides the fixed current IF to the internal node NI, the capacitor C provides an instant large current from the high-level voltage VH to the internal node NI and the driving node ND once the first switch S1 in FIG. 3 is turned on, so as to instantly turn on the power switch 320 in FIG. 3.

Figure 7:
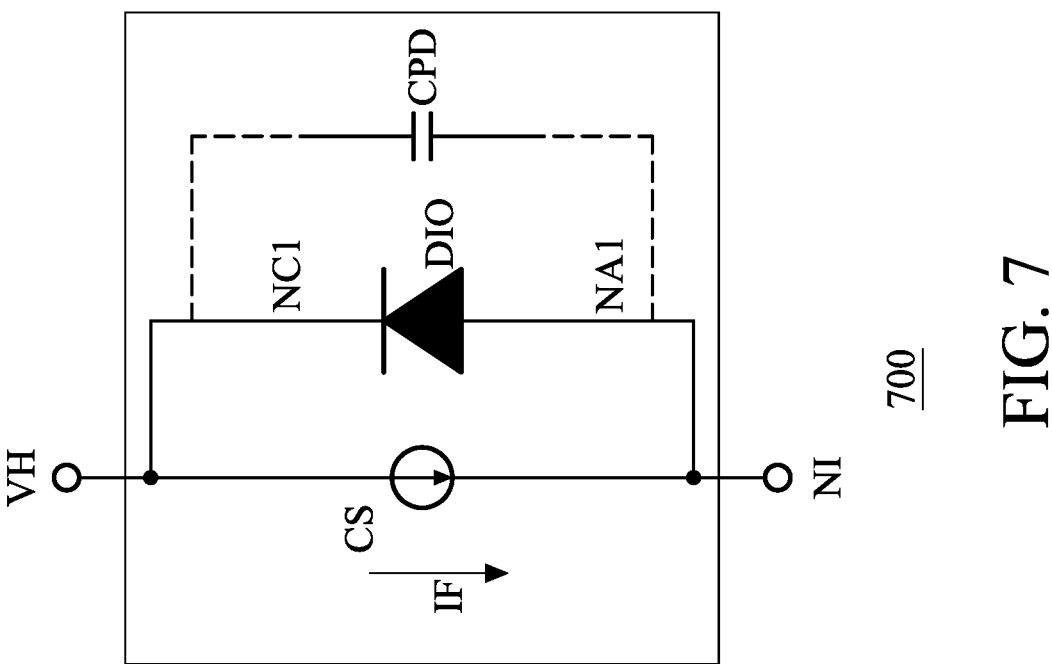
FIG. 7 is a schematic diagram of a first control circuit in accordance with yet another embodiment of the present disclosure.

FIG. 7 is a schematic diagram of a first control circuit in accordance with yet another embodiment of the present disclosure. As shown in FIG. 7, the first control circuit 700 includes a current source CS and a diode DIO. According to an embodiment of the present disclosure, the current source CS may correspond to the current source 400 in FIG. 4. According to another embodiment of the present disclosure, the current source CS may correspond to the current source 500 in FIG. 5.

The diode DIO includes a first anode NA1 and a first cathode NC1, where the first anode NA1 is coupled to the internal node NI and the first cathode NC1 is coupled to the high-level voltage VH. According to some embodiments of the present disclosure, the diode DIO further includes a parasitic capacitor CPD, where the parasitic capacitor CPD provides an instant large current from the high-level voltage VH to the internal node NI and the driving node ND once the first switch S1 in FIG. 3 is turned on, so as to instantly turn on the power switch 320 in FIG. 3.

Figure 8:
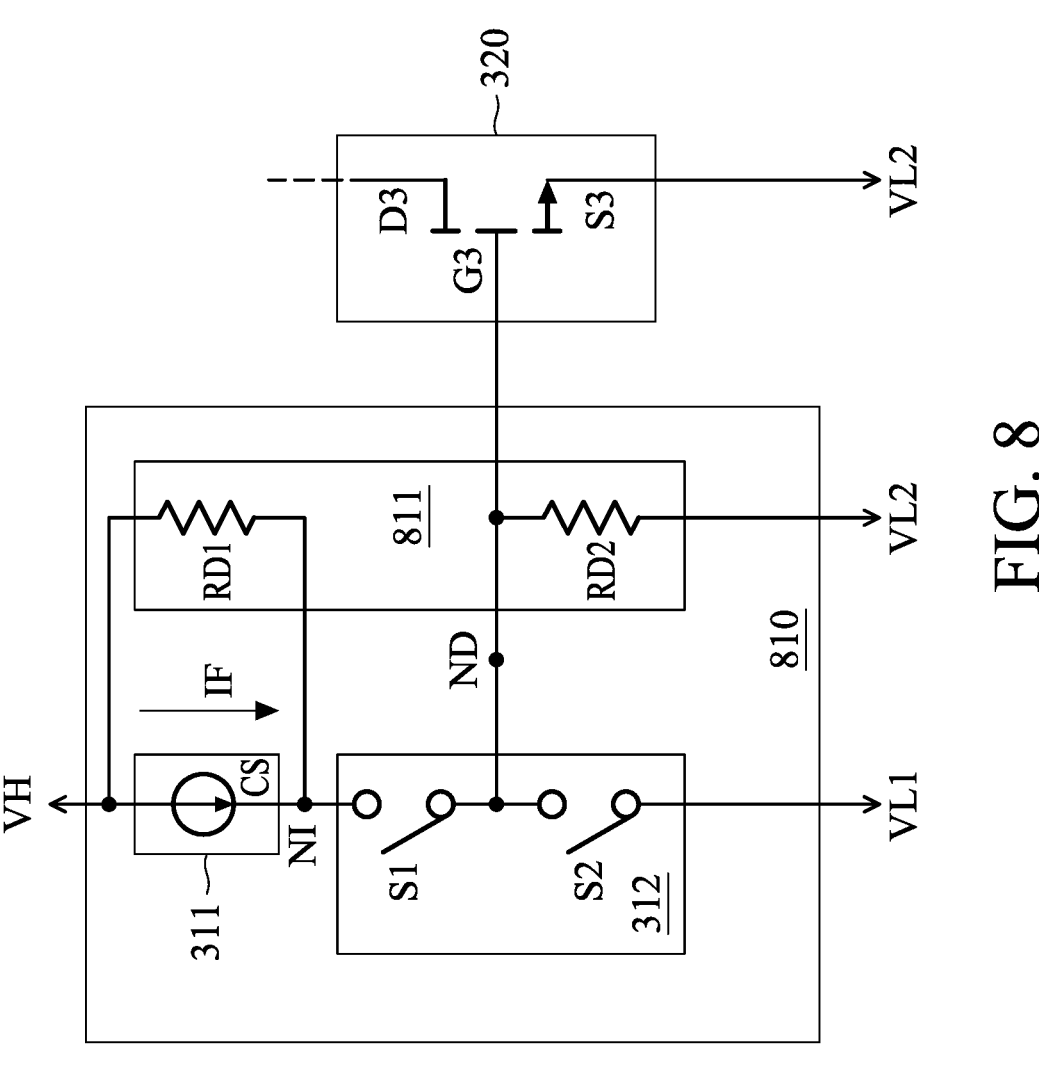
FIG. 8 is a schematic diagram of an electronic circuit in accordance with another embodiment of the present disclosure.

FIG. 8 is a schematic diagram of an electronic circuit in accordance with another embodiment of the present disclosure. Comparing to the electronic circuit 300 in FIG. 3, the driving circuit 810 of the electronic circuit 800 in FIG. 8 further includes the dividing circuit 811.

As shown in FIG. 8, the dividing circuit 811 includes a first dividing resistor RD1 and a second dividing resistor RD2. The first dividing resistor RD1 is coupled between the high-level voltage VH and the internal node NI. The second dividing resistor RD2 is coupled between the driving node ND and the second low-level voltage VL2. According to some embodiments of the present disclosure, the dividing circuit 811 is configured to determine the voltage of the driving node ND.

According to some embodiments of the present disclosure, no matter the power switch 320 is a current-driven switch or a voltage-driven switch, the dividing circuit 811 is configured to set the voltage of the driving node ND to bias the third gate terminal G3 of the power switch 320 and to provide extra current to the third gate terminal G3 of the power switch 320.

According to some embodiments of the present disclosure, the first control circuit 311, the second control circuit 312, and the dividing circuit 811 of the driving circuit 810 may be integrated or packaged together. According to an embodiment of the present disclosure, the first control circuit 311, the second control circuit 312, and the dividing circuit 811 of the driving circuit 810 may be integrated using System on Chip (SoC) technology. According to another embodiment of the present disclosure, the driving circuit 810 may be packaged using System in Package (SiP) technology. According to another embodiment of the present disclosure, the first control circuit 311, the second control circuit 312, and the dividing circuit 811 of the driving circuit 810 may be packaged in 3-dimensional package.

Figure 9:
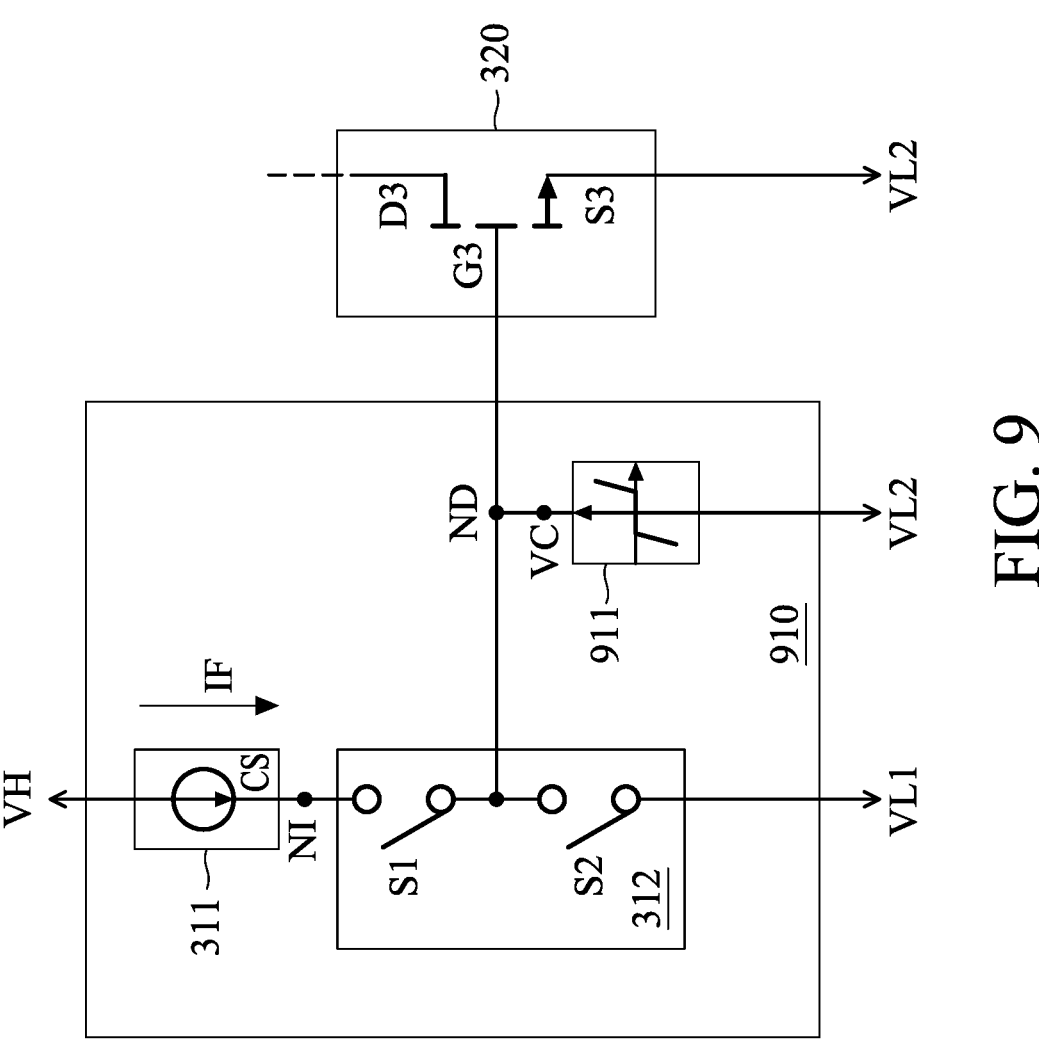
FIG. 9 is a schematic diagram of an electronic circuit in accordance with yet another embodiment of the present disclosure.

FIG. 9 is a schematic diagram of an electronic circuit in accordance with yet another embodiment of the present disclosure. As shown in FIG. 9, the driving circuit 910 of the electronic circuit 900 further includes a voltage clamp unit 911. The voltage clamp unit 911 is coupled between the driving node ND and the low-level voltage VL2, and configured to clamp the voltage of the driving node ND as a clamp voltage VC. In other words, the voltage clamp unit 911 is configured to clamp the voltage across the third gate terminal G3 to the source terminal S3 of the power switch 320.

According to an embodiment of the present disclosure, when the voltage of the driving node ND exceeds the forward-biased voltage of the voltage clamp unit 911, the voltage of the driving node ND is clamped at the forward-biased voltage of the voltage clamp unit 911. According to another embodiment of the present disclosure, when the voltage of the second low-level voltage VL2 minus the first low-level voltage VL1 exceeds the reverse-biased voltage of the voltage clamp unit 911 during the second switch S2 being turned on, the voltage of the driving node ND is clamped at the voltage equal to the second low-level voltage VL2 minus the reverse-biased voltage of the voltage clamp unit 911.

According to some embodiments of the present disclosure, the first control circuit 311, the second control circuit 312, and the voltage clamp unit 911 of the driving circuit 910 may be integrated or packaged together. According to an embodiment of the present disclosure, the first control circuit 311, the second control circuit 312, and the voltage clamp unit 911 of the driving circuit 910 may be integrated using System on Chip (SoC) technology. According to another embodiment of the present disclosure, the first control circuit 311, the second control circuit 312, and the voltage clamp unit 911 of the driving circuit 910 may be packaged using System in Package (SiP) technology. According to another embodiment of the present disclosure, the first control circuit 311, the second control circuit 312, and the voltage clamp unit 911 of the driving circuit 910 may be packaged in 3-dimensional package.

Figures 10, 11, 12, 13, 14:
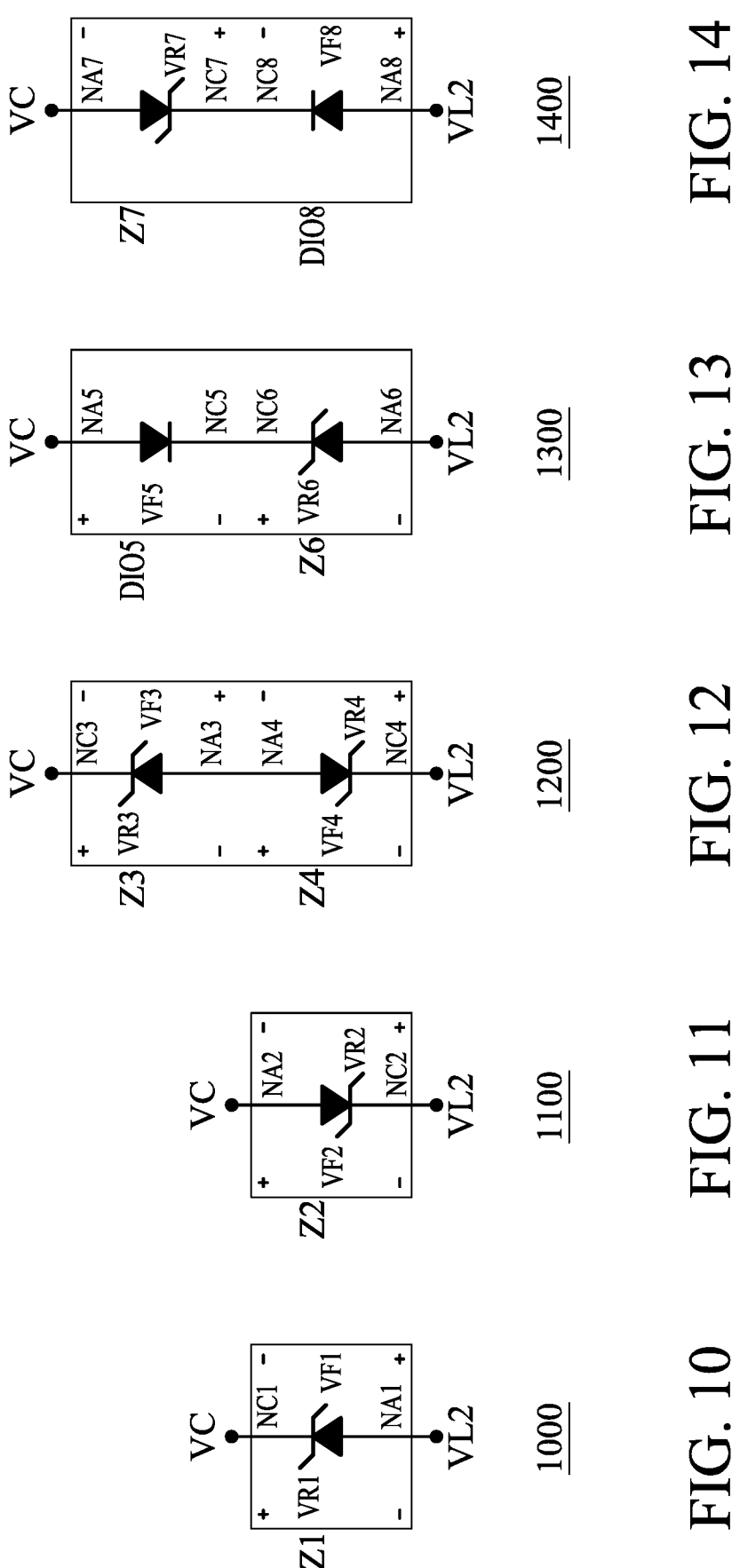
FIG. 10 a schematic diagram of a voltage clamp unit in accordance with an embodiment of the present disclosure.
FIG. 11 is a schematic diagram of a voltage clamp unit in accordance with another embodiment of the present disclosure.
FIG. 12 is a schematic diagram of a voltage clamp unit in accordance with yet another embodiment of the present disclosure.
FIG. 13 is a schematic diagram of a voltage clamp unit in accordance with yet another embodiment of the present disclosure.
FIG. 14 is a schematic diagram of a voltage clamp unit in accordance with yet another embodiment of the present disclosure.

FIG. 10 a schematic diagram of a voltage clamp unit in accordance with an embodiment of the present disclosure, where the voltage clamp unit 1000 corresponds to the voltage clamp unit 911. As shown in FIG. 10, the voltage clamp unit 1000 includes a first Zener diode Z1 including a first anode NA1 and a first cathode NC1. The first anode NA1 is coupled to the second low-level voltage VL2, and the first cathode NC1 is coupled to the clamp voltage VC (i.e., the driving node ND).

According to an embodiment of the present disclosure, when the first switch S1 in FIG. 9 is turned on and the voltage of the internal node NI exceeds the voltage of the first reverse voltage VR1 of the first Zener diode Z1 minus the second low-level voltage VL2, the voltage of the driving node ND and the clamp voltage VC is clamped at a first reverse voltage VR1 of the first Zener diode Z1. According to another embodiment of the present disclosure, when the second switch S2 in FIG. 9 is turned on and the first switch S1 is turned off and the voltage of the second low-level voltage VL2 minus the first low-level voltage VL1 exceeds the first forward voltage VF1 of the first Zener diode Z1, the voltage of the driving node ND and the clamp voltage VC is clamped at the voltage that is equal to the second low-level voltage VL2 minus the first forward voltage VF1 of the first Zener diode Z1.

In other words, when the first switch S1 in FIG. 9 is turned on, the voltage from the third gate terminal G3 to the third source terminal S3 of the power switch 320 is clamped at the first reverse voltage VR1. When the second switch S2 in FIG. 9 is turned on and the first switch S1 is turned off, the voltage from the third source terminal S3 to the third gate terminal G3 of the power switch 320 is clamped at the first forward voltage VF1.

FIG. 11 is a schematic diagram of a voltage clamp unit in accordance with another embodiment of the present disclosure, where the voltage clamp unit 1100 corresponds to the voltage clamp unit 911. As shown in FIG. 11, the voltage clamp unit 1100 includes a second Zener diode Z2 including a second anode NA2 and a second cathode NC2. The second anode NA2 is coupled to the clamp voltage VC (or the driving node ND), and the second cathode NC2 is coupled to the second low-level voltage VL2.

According to an embodiment of the present disclosure, when the first switch S1 in FIG. 9 is turned on and the voltage of the internal node NI exceeds the second forward voltage VF2 of the second Zener diode Z2 minus the second low-level voltage VL2, the voltage of the driving node ND and the clamp voltage VC is clamped at a second forward voltage VF2 of the second Zener diode Z2. According to another embodiment of the present disclosure, when the second switch S2 in FIG. 9 is turned on and the first switch S1 is turned off and the voltage of the second low-level voltage VL2 minus the first low-level voltage VL1 exceeds the second reverse voltage VR2 minus the second low-level voltage VL2, the voltage of the driving node ND and the clamp voltage VC is clamped at the voltage that is equal to the second low-level voltage VL2 minus a second reverse voltage VR2.

In other words, when the first switch S1 in FIG. 9 is turned on, the voltage from the third gate terminal G3 to the third source terminal S3 of the power switch 320 is clamped at the second forward voltage VF2. When the second switch S2 in FIG. 9 is turned on and the first switch S1 is turned off, the voltage from the third source terminal S3 to the third gate terminal G3 of the power switch 320 is clamped at the second reverse voltage VR2.

FIG. 12 is a schematic diagram of a voltage clamp unit in accordance with yet another embodiment of the present disclosure, where the voltage clamp unit 1200 corresponds to the voltage clamp unit 911. As shown in FIG. 12, the voltage clamp unit 1200 includes a third Zener diode Z3 including a third anode NA3 and a third cathode NC3 and a fourth Zener diode Z4 including a fourth anode NA4 and a fourth cathode NC4. The third cathode NC3 is coupled to the clamp voltage VC (or the driving node ND), the third anode NA3 is coupled to the fourth anode NA4, and the fourth cathode NC4 is coupled to the second low-level voltage VL2.

According to an embodiment of the present disclosure, when the first switch S1 in FIG. 9 is turned on and the voltage of the internal node NI exceeds the sum of the third reverse voltage VR3 of the third Zener diode Z3 and the fourth forward voltage VF4 of the fourth Zener diode Z4 minus the second low-level voltage VL2, the voltage of the driving node ND and the clamp voltage VC is clamped at the sum of the third reverse voltage VR3 of the third Zener diode Z3 and the fourth forward voltage VF4 of the fourth Zener diode Z4. According to another embodiment of the present disclosure, when the second switch S2 in FIG. 9 is turned on and the first switch S1 is turned off and the voltage of the second low-level voltage VL2 minus the first low-level voltage VL1 exceeds the sum of the third forward voltage VF3 of the third Zener diode Z3 and the fourth reverse voltage VR4 of the fourth Zener diode Z4 minus the second low-level voltage VL2, the voltage of the driving node ND and the clamp voltage VC is clamped at a voltage that is equal to the second low-level voltage VL2 minus the sum of the third forward voltage VF3 of the third Zener diode Z3 and the fourth reverse voltage VR4 of the fourth Zener diode Z4.

In other words, when the first switch S1 in FIG. 9 is turned on, the voltage from the third gate terminal G3 to the third source terminal S3 of the power switch 320 is clamped at the sum of the third reverse voltage VR3 and the fourth forward voltage VF4. When the second switch S2 in FIG. 9 is turned on and the first switch S1 is turned off, the voltage from the third source terminal S3 to the third gate terminal G3 of the power switch 320 is clamped at the sum of the third forward voltage VF3 and the fourth reverse voltage VR4.

FIG. 13 is a schematic diagram of a voltage clamp unit in accordance with yet another embodiment of the present disclosure, where the voltage clamp unit 1300 corresponds to the voltage clamp unit 911. As shown in FIG. 13, the voltage clamp unit 1300 includes a fifth diode DIO5 including a fifth anode NA5 and a fifth cathode NC5 and a sixth Zener diode Z6 including a sixth anode NA6 and a sixth cathode NC6. The fifth anode NA5 is coupled to the clamp voltage VC (or the driving node ND), the fifth cathode NC5 is coupled to the sixth cathode NC6, and the sixth anode NA6 is coupled to the second low-level voltage VL2.

According to an embodiment of the present disclosure, when the first switch S1 in FIG. 9 is turned on and the voltage of the internal node NI exceeds the sum of the fifth forward voltage VF5 of the fifth diode DIO5 and the sixth reverse voltage VR6 of the sixth Zener diode Z6 minus the second low-level voltage VL2, the voltage of the driving node ND and the clamp voltage VC is clamped at the sum of the fifth forward voltage VF5 of the fifth diode DIO5 and the sixth reverse voltage VR6 of the sixth Zener diode Z6. In other words, when the first switch S1 in FIG. 9 is turned on, the voltage from the third gate terminal G3 to the third source terminal S3 of the power switch 320 is clamped at the sum of the fifth forward voltage VF5 and the sixth reverse voltage VR6.

FIG. 14 is a schematic diagram of a voltage clamp unit in accordance with yet another embodiment of the present disclosure, where the voltage clamp unit 1400 corresponds to the voltage clamp unit 911. As shown in FIG. 14, the voltage clamp unit 1400 includes a seventh Zener diode Z7 including a seventh anode NA7 and a seventh cathode NC7 and an eighth diode DIO8 including an eighth anode NA8 and an eighth cathode NC8. The seventh anode NA7 is coupled to the clamp voltage VC (or the driving node ND), the seventh cathode NC7 is coupled to the eighth cathode NC8, and the eighth anode NA8 is coupled to the second low-level voltage VL2.

According to an embodiment of the present disclosure, when the second switch S2 in FIG. 9 is turned on and the first switch S1 is turned off and the voltage of the second low-level voltage VL2 minus the first low-level voltage VL1 exceeds the sum of the eighth forward voltage VF8 of the eighth diode DIO8 and the seventh reverse voltage VR7 of the seventh Zener diode Z7, the voltage of the driving node ND and the clamp voltage VC is clamped at the voltage that is equal to the second low-level voltage VL2 minus the sum of the eighth forward voltage VF8 of the eighth diode DIO8 and the seventh reverse voltage VR7 of the seventh Zener diode Z7.

In other words, when the second switch S2 in FIG. 9 is turned on and the first switch S1 is turned off, the voltage from the third source terminal S3 to the third gate terminal G3 of the power switch 320 is clamped at the sum of the eighth forward voltage VF8 of the eighth diode DIO8 and the seventh reverse voltage VR7 of the seventh Zener diode Z7.

Figure 15:
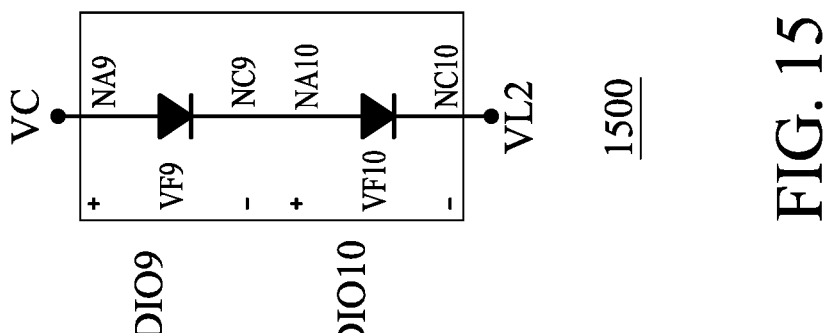
FIG. 15 is a schematic diagram of a voltage clamp unit in accordance with yet another embodiment of the present disclosure.

FIG. 15 is a schematic diagram of a voltage clamp unit in accordance with yet another embodiment of the present disclosure, where the voltage clamp unit 1500 corresponds to the voltage clamp unit 911. As shown in FIG. 15, the voltage clamp unit 1500 includes a ninth diode DIO9 including a ninth anode NA9 and a ninth cathode NC9 and a tenth diode DIO10 including a tenth anode NA10 and a tenth cathode NC10. The ninth anode NA9 is coupled to the clamp voltage VC (or the driving node ND), the ninth cathode NC9 is coupled to the tenth anode NA10, and the tenth cathode NC10 is coupled to the second low-level voltage VL2.

According to an embodiment of the present disclosure, when the first switch S1 in FIG. 9 is turned on and the voltage of the internal node NI exceeds the sum of the ninth forward voltage VF9 of the ninth diode DIO9 and the tenth forward voltage VF10 of the tenth diode DIO10, the voltage of the driving node ND and the clamp voltage VC is clamped at the sum of the ninth forward voltage VF9 of the ninth diode DIO9 and the tenth forward voltage VF10 of the tenth diode DIO10. In other words, when the first switch S1 in FIG. 9 is turned on, the voltage from the third gate terminal G3 to the third source terminal S3 of the power switch 320 is clamped at the sum of the ninth forward voltage VF9 of the ninth diode DIO9 and the tenth forward voltage VF10 of the tenth diode DIO10.

Figure 16:
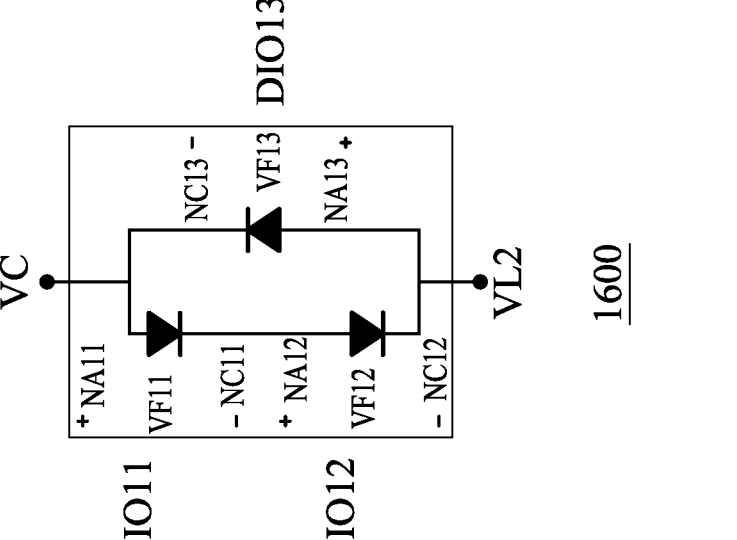
FIG. 16 is a schematic diagram of a voltage clamp unit in accordance with yet another embodiment of the present disclosure.

FIG. 16 is a schematic diagram of a voltage clamp unit in accordance with yet another embodiment of the present disclosure, where the voltage clamp unit 1600 corresponds to the voltage clamp unit 911. As shown in FIG. 16, the voltage clamp unit 1600 includes an eleventh diode DIO11 including an eleventh anode NA11, an eleventh cathode NC11, a twelfth diode DIO12 including a twelfth anode NA12 and a twelfth cathode NC12, and a thirteenth diode DIO13 including a thirteenth anode NA13 and a thirteenth cathode NC13. The eleventh anode NA11 and the thirteenth cathode NC13 are coupled to the clamp voltage VC (or the driving node ND), the eleventh cathode NC11 is coupled to the twelfth anode NA12, and the twelfth cathode NC12 and the thirteenth anode NA13 are coupled to the second low-level voltage VL2.

According to an embodiment of the present disclosure, when the first switch S1 in FIG. 9 is turned on and the voltage of the internal node NI exceeds the sum of the eleventh forward voltage VF11 of the eleventh diode DIO11 and the twelfth forward voltage VF12 of the twelfth diode DIO12 minus the second low-level voltage VL2, the voltage of the driving node ND and the clamp voltage VC is clamped at the sum of the eleventh forward voltage VF11 of the eleventh diode DIO11 and the twelfth forward voltage VF12 of the twelfth diode DIO12. According to another embodiment of the present disclosure, when the second switch S2 in FIG. 9 is turned on and the first switch S1 is turned off and the voltage of the second low-level voltage VL2 minus the first low-level voltage VL1 exceeds a thirteenth forward voltage VF13 of the thirteen diode DIO13, the voltage of the driving node ND and the clamp voltage VC is clamped at the voltage equal to the second low-level voltage VL2 minus a thirteenth forward voltage VF13 of the thirteen diode DIO13.

In other words, when the first switch S1 in FIG. 9 is turned on, the voltage from the third gate terminal G3 to the third source terminal S3 of the power switch 320 is clamped at the sum of the eleventh forward voltage VF11 of the eleventh diode DIO11 and the twelfth forward voltage VF12 of the twelfth diode DIO12. When the second switch S2 in FIG. 9 is turned on and the first switch S1 is turned off, the voltage from the third source terminal S3 to the third gate terminal G3 of the power switch 320 is clamped at the thirteenth forward voltage VF13 of the thirteen diode DIO13.

Figure 17:
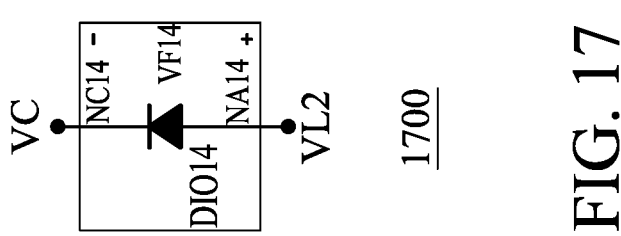
FIG. 17 is a schematic diagram of a voltage clamp unit in accordance with yet another embodiment of the present disclosure.

FIG. 17 is a schematic diagram of a voltage clamp unit in accordance with yet another embodiment of the present disclosure, where the voltage clamp unit 1700 corresponds to the voltage clamp unit 911. As shown in FIG. 17, the voltage clamp unit 1700 includes a fourteenth diode DIO14 including a fourteenth anode NA14 and a fourteenth cathode NC14. The fourteenth cathode NC14 is coupled to the clamp voltage VC (or the driving node ND), and the fourteenth anode NA14 is coupled to the second low-level voltage VL2.

According to an embodiment of the present disclosure, when the second switch S2 in FIG. 9 is turned on and the first switch S1 is turned off and the voltage of the second low-level voltage VL2 minus the first low-level voltage VL1 exceeds the fourteenth forward voltage VF14 of the fourteen diode DIO14, the voltage of the driving node ND and the clamp voltage VC is clamped at a voltage that is equal to the second low-level voltage VL2 minus the fourteenth forward voltage VF14 of the fourteen diode DIO14.

In other words, when the second switch S2 in FIG. 9 is turned on and the first switch S1 is turned off, the voltage from the third source terminal S3 to the third gate terminal G3 of the power switch 320 is clamped at the fourteenth forward voltage VF14 of the fourteenth diode DIO14.

Figure 18:
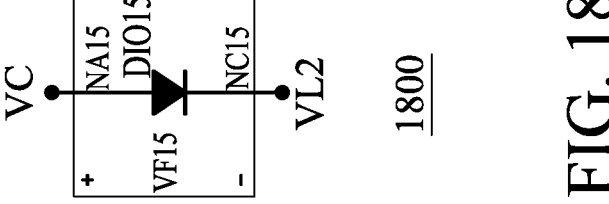
FIG. 18 is a schematic diagram of a voltage clamp unit in accordance with yet another embodiment of the present disclosure.

FIG. 18 is a schematic diagram of a voltage clamp unit in accordance with yet another embodiment of the present disclosure, where the voltage clamp unit 1800 corresponds to the voltage clamp unit 911. As shown in FIG. 18, the voltage clamp unit 1800 includes a fifteenth diode DIO15 including a fifteenth anode NA15 and a fifteenth cathode NC15. The fifteenth cathode NC15 is coupled to the clamp voltage VC (or the driving node ND), and the fifteenth anode NA15 is coupled to the second low-level voltage VL2.

According to an embodiment of the present disclosure, when the first switch S1 in FIG. 9 is turned on and the voltage of the internal node NI exceeds the fifteenth forward voltage VF15 of the fifteenth diode DIO15 minus the second low-level voltage VL2, the voltage of the driving node ND and the clamp voltage VC is clamped at the fifteenth forward voltage VF15 of the fifteenth diode DIO15 minus the second low-level voltage VL2. In other words, when the first switch S1 in FIG. 9 is turned on, the voltage from the third gate terminal G3 to the third source terminal S3 of the power switch 320 is clamped at the fifteenth forward voltage VF15 of the fifteenth diode DIO15.

Figure 19:
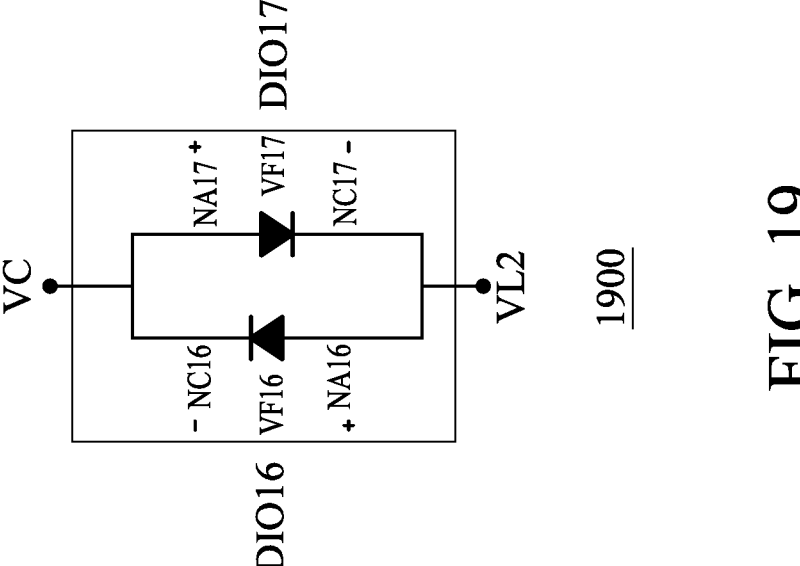
FIG. 19 is a schematic diagram of a voltage clamp unit in accordance with yet another embodiment of the present disclosure.

FIG. 19 is a schematic diagram of a voltage clamp unit in accordance with yet another embodiment of the present disclosure, where the voltage clamp unit 1900 corresponds to the voltage clamp unit 911. As shown in FIG. 19, the voltage clamp unit 1900 includes a sixteenth diode DIO16 including a sixteenth anode NA16 and a sixteenth cathode NC16 and a seventeenth diode DIO17 including a seventeenth anode NA17 and a seventeenth cathode NC17. The sixteenth cathode NC16 and the seventeenth anode NA17 are coupled to the clamp voltage VC (or the driving node ND), and the sixteenth anode NA16 and the seventeenth cathode NC17 are coupled to the second low-level voltage VL2.

According to an embodiment of the present disclosure, when the first switch S1 in FIG. 9 is turned on and the voltage of the internal node NI exceeds the voltage of the seventeenth forward voltage VF17 of the seventeenth diode DIO17 minus the second low-level voltage VL2, the voltage of the driving node ND and the clamp voltage VC is clamped at the seventeenth forward voltage VF17 of the seventeenth diode DIO17 minus the second low-level voltage VL2. According to another embodiment of the present disclosure, when the second switch S2 in FIG. 9 is turned on and the first switch S1 is turned off and the voltage of the second low-level voltage VL2 minus the first low-level voltage VL1 exceeds the sixteenth forward voltage VF16 of the sixteenth diode DIO16, the voltage of the driving node ND and the clamp voltage VC is clamped at a voltage that is equal to the second low-level voltage VL2 minus the sixteenth forward voltage VF16 of the sixteenth diode DIO16.

In other words, when the first switch S1 in FIG. 9 is turned on, the voltage from the third gate terminal G3 to the third source terminal S3 of the power switch 320 is clamped at the seventeenth forward voltage VF17 of the seventeenth diode DIO17. When the second switch S2 in FIG. 9 is turned on and the first switch S1 is turned off, the voltage from the third source terminal S3 to the third gate terminal G3 of the power switch 320 is clamped at the sixteenth forward voltage VF16 of the sixteenth diode DIO16.

Figure 20:
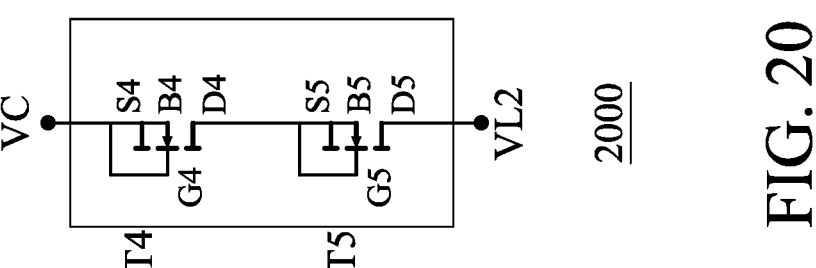
FIG. 20 is a schematic diagram of a voltage clamp unit in accordance with yet another embodiment of the present disclosure.

FIG. 20 is a schematic diagram of a voltage clamp unit in accordance with yet another embodiment of the present disclosure, where the voltage clamp unit 1000 corresponds to the voltage clamp unit 911. As shown in FIG. 20, the voltage clamp unit 2000 includes a fourth transistor T4 including a fourth gate terminal G4, a fourth drain terminal D4, a fourth base terminal B4, and a fourth source terminal S4 and a fifth transistor T5 including a fifth gate terminal G5, a fifth drain terminal D5, a fifth base terminal B5, and a fifth source terminal S5.

The fourth source terminal S4 is coupled to the fourth gate terminal G4, the fourth base terminal B4, and the clamp voltage VC (or the driving node ND). The fourth drain terminal D4 is coupled to the fifth source terminal S5, the fifth gate terminal G5, and the fifth base terminal B5. The fifth drain terminal D5 is coupled to the second low-level voltage VL2.

According to an embodiment of the present disclosure, the voltage clamp unit 2000 couples the body diodes of the fourth transistor T4 and fifth transistor T5 as the configuration of the ninth diode DIO9 and the tenth diode DIO10 in FIG. 15, which will not be repeated herein.

Figure 21:
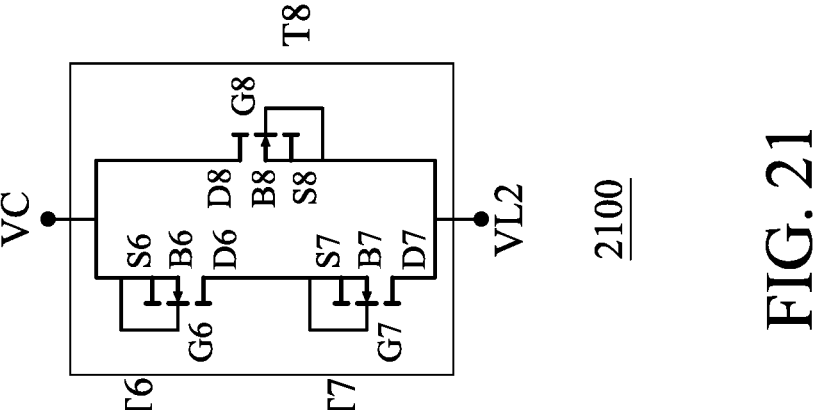
FIG. 21 is a schematic diagram of a voltage clamp unit in accordance with yet another embodiment of the present disclosure.

FIG. 21 is a schematic diagram of a voltage clamp unit in accordance with yet another embodiment of the present disclosure, where the voltage clamp unit 2100 corresponds to the voltage clamp unit 911. As shown in FIG. 21, the voltage clamp unit 2100 includes a sixth transistor T6 including a sixth gate terminal G6, a sixth drain terminal D6, a sixth base terminal B6, and a sixth source terminal S6, a seventh transistor T7 including a seventh gate terminal G7, a seventh drain terminal D7, a seventh base terminal B7, and a seventh source terminal S7, and an eighth transistor T8 including an eighth gate terminal G8, an eighth drain terminal D8, an eighth base terminal B8, and an eighth source terminal S8.

The sixth source terminal S6 is coupled to the sixth gate terminal G6, the sixth base terminal B6, the eighth drain terminal D8, and the clamp voltage VC (or the driving node ND). The sixth drain terminal D6 is coupled to the seventh source terminal S7, the seventh gate terminal G7, and the seventh base terminal B7. The seventh drain terminal D7 is coupled to the second low-level voltage VL2, the eighth gate terminal G8, the eighth base terminal B8, and the eighth source terminal S8.

According to an embodiment of the present disclosure, the voltage clamp unit 2100 couples the body diodes of the sixth transistor T6, the seventh transistor T7, and eighth transistor T8 as the configuration of the eleventh diode DIO11, the twelfth diode DIO12, and the thirteenth diode DIO13 in FIG. 16, which will not be repeated herein.

Figure 22:
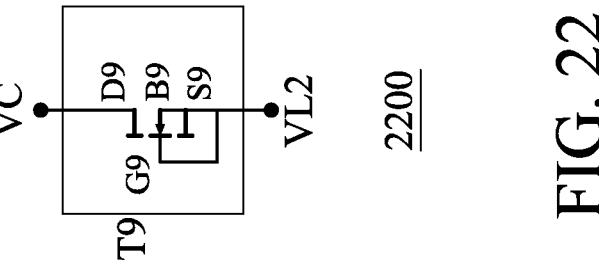
FIG. 22 is a schematic diagram of a voltage clamp unit in accordance with yet another embodiment of the present disclosure.

FIG. 22 is a schematic diagram of a voltage clamp unit in accordance with yet another embodiment of the present disclosure, where the voltage clamp unit 2200 corresponds to the voltage clamp unit 911. As shown in FIG. 22, the voltage clamp unit 2200 includes a ninth transistor T9 including a ninth gate terminal G9, a ninth drain terminal D9, a ninth base terminal B9, and a ninth source terminal S9. The ninth source terminal S9 is coupled to the ninth gate terminal G9, the ninth base terminal B9, and the second low-level voltage VL2. The ninth drain terminal D9 is coupled to the clamp voltage VC (or the driving node ND).

According to an embodiment of the present disclosure, the voltage clamp unit 2200 couples the body diode of the ninth transistor T9 as the configuration of the fourteenth diode DIO14 in FIG. 17, which will not be repeated herein.

Figure 23:
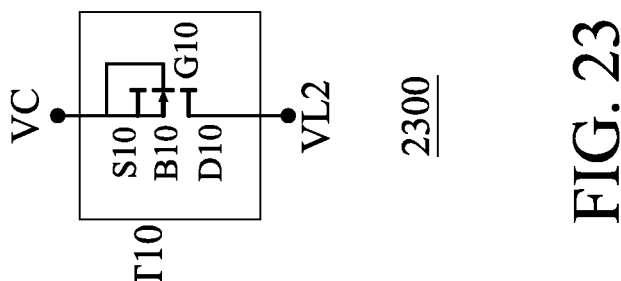
FIG. 23 is a schematic diagram of a voltage clamp unit in accordance with yet another embodiment of the present disclosure.

FIG. 23 is a schematic diagram of a voltage clamp unit in accordance with yet another embodiment of the present disclosure, where the voltage clamp unit 2300 corresponds to the voltage clamp unit 911. As shown in FIG. 23, the voltage clamp unit 2300 includes a tenth transistor T10 including a tenth gate terminal G10, a tenth drain terminal D10, a tenth base terminal B10, and a tenth source terminal S10. The tenth source terminal S10 is coupled to the tenth gate terminal G10, the tenth base terminal B10, and the clamp voltage VC (or the driving node ND). The tenth drain terminal D10 is coupled to the second low-level voltage VL2.

According to an embodiment of the present disclosure, the voltage clamp unit 2300 couples the body diode of the tenth transistor T10 as the configuration of the fifteenth diode DIO15 in FIG. 18, which will not be repeated herein.

Figure 24:
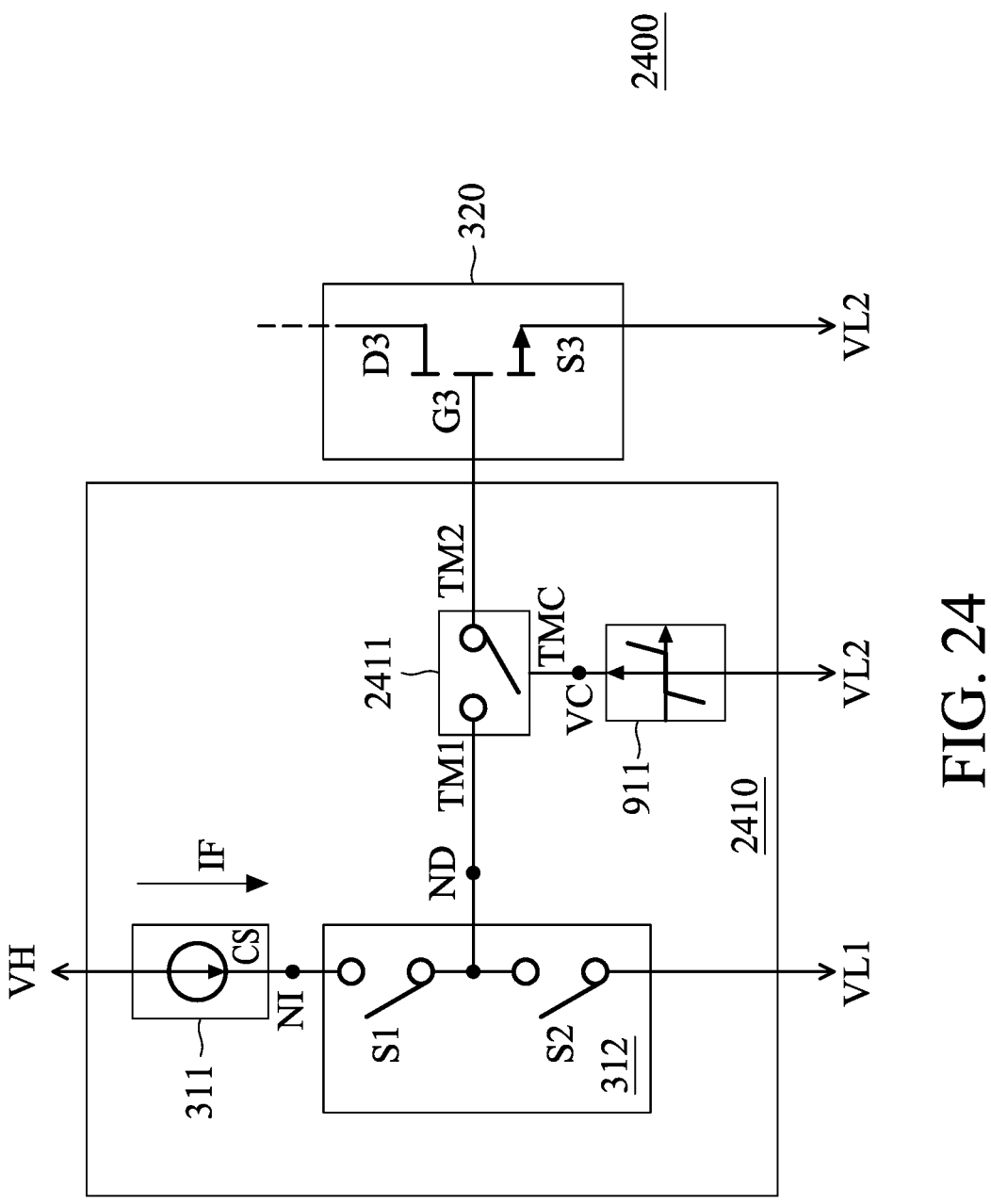
FIG. 24 is a schematic diagram of an electronic circuit in accordance with yet another embodiment of the present disclosure.

FIG. 24 is a schematic diagram of an electronic circuit in accordance with yet another embodiment of the present disclosure. As shown in FIG. 24, the driving circuit 2410 of the electronic circuit 2400 further includes a voltage-controlled switch 2411, compared to the electronic circuit 900 in FIG. 9.

The voltage-controlled switch 2411 includes a first terminal TM1, a second terminal TM2, and a control terminal TMC. The first terminal TM1 is coupled to the driving node ND. The second terminal TM2 is coupled to the third gate terminal G3 of the power switch 320. The control terminal TMC is coupled to the clamp voltage VC.

According to an embodiment of the present disclosure, when the first switch S1 is turned on, the voltage of the internal node NI is provided to the control terminal TMC of the voltage-controlled switch 2411 through the parasitic capacitance between the first terminal TM1 and the control terminal TMC (not shown in FIG. 24), so as to turn on the voltage-controlled switch 2411. Accordingly, the voltage of the internal node NI may be provided to the third gate terminal G3 of the power switch 320. According to some embodiments of the present disclosure, the voltage of the third gate terminal G3 of the power switch 320 is determined by the voltage across the second terminal TM2 and the control terminal TMC and the clamp voltage VC.

According to some embodiments of the present disclosure, the driving circuit 2410 may be integrated or packaged together. According to an embodiment of the present disclosure, the first control circuit 311, the second control circuit 312, the voltage clamp unit 911, and the voltage-controlled circuit 2411 of the driving circuit 2410 may be integrated using System on Chip (SoC) technology. According to another embodiment of the present disclosure, the first control circuit 311, the second control circuit 312, the voltage clamp unit 911, and the voltage-controlled circuit 2411 of the driving circuit 2410 may be packaged System in Package (SiP) technology. According to another embodiment of the present disclosure, the first control circuit 311, the second control circuit 312, the voltage clamp unit 911, and the voltage-controlled circuit 2411 of the driving circuit 2410 may be packaged in 3-dimensional package.

Figure 25:
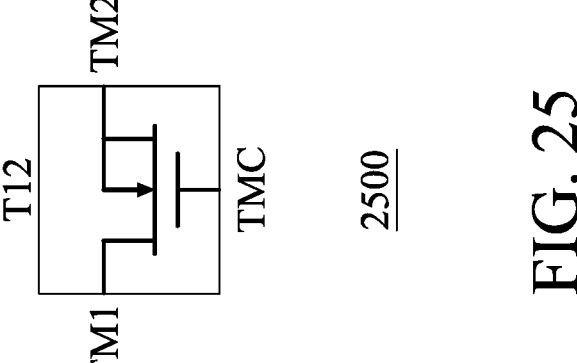
FIG. 25 is a schematic diagram of a voltage-controlled switch in accordance with an embodiment of the present disclosure.

FIG. 25 is a schematic diagram of a voltage-controlled switch in accordance with an embodiment of the present disclosure. As shown in FIG. 25, the voltage-controlled switch 2500 includes the twelfth transistor T12. According to an embodiment of the present disclosure, the twelfth transistor T12 is a normally-on transistor.

The twelfth transistor T12 includes the first terminal TM1, the second terminal TM2, and the control terminal TMC. In other words, the voltage-controlled switch 2411 in FIG. 24 may be replaced by the twelfth transistor T12. According to an embodiment of the present disclosure, since the twelfth transistor T12 is a normally-on transistor and the clamp voltage VC is clamped by the voltage clamp unit 911, the third gate terminal G3 of the power switch 320 may be charged up to the sum of the clamp voltage VC and the threshold voltage of the twelfth transistor T12.

According to another embodiment of the present disclosure, when the second switch S2 is turned on and the first switch S1 is turned off, the voltage of the third gate terminal G3 of the power switch 320 is determined by the second low-level voltage VL2 minus the first low-level voltage VL1. In other words, when the voltage of the control terminal TMC to the second terminal TM2 is less than the threshold of the twelfth transistor T12, the twelfth transistor T12 is turned off so as to set the voltage of the third gate terminal G3 of the power switch 320, where the voltage of the control terminal TMC is determined by the voltage clamp unit 911.

Figure 26:
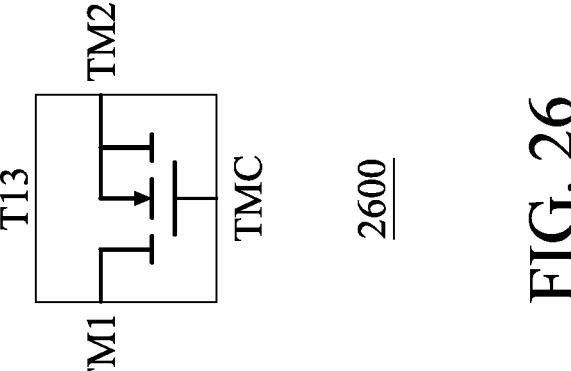
FIG. 26 is a schematic diagram of a voltage-controlled switch in accordance with another embodiment of the present disclosure.

FIG. 26 is a schematic diagram of a voltage-controlled switch in accordance with another embodiment of the present disclosure. As shown in FIG. 26, the voltage-controlled switch 2600 includes the thirteenth transistor T13. According to an embodiment of the present disclosure, the thirteenth transistor T13 is a normally-off transistor.

The thirteenth transistor T13 includes the first terminal TM1, the second terminal TM2, and the control terminal TMC. In other words, the voltage-controlled switch 2411 in FIG. 24 may be replaced by the thirteenth transistor T13. According to an embodiment of the present disclosure, once the first switch S1 in FIG. 24 is turned on, the voltage of the internal node NI is coupled to the control terminal TMC through the parasitic capacitance across the first terminal TM1 to the control terminal TMC, so as to turn on the thirteenth transistor T13.

When the voltage of the control terminal TMC to the second terminal TM2 is less than a threshold of the thirteenth transistor T13, the thirteenth transistor T13 is turned off so as to set the voltage of the third gate terminal G3 of the power switch 320. In other words, the voltage of the third gate terminal G3 of the power switch 320 is equal to the clamp voltage VC minus the threshold voltage of the voltage-controlled switch 2411.

Figure 27:
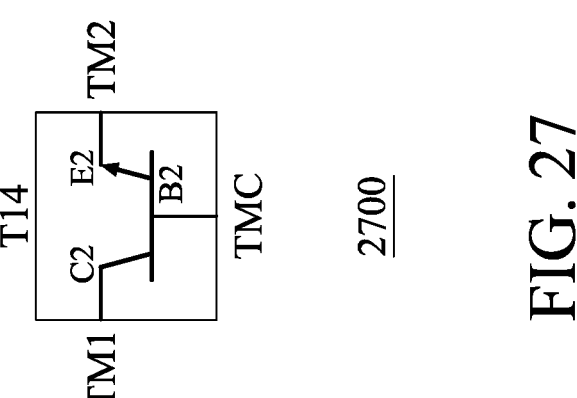
FIG. 27 is a schematic diagram of a voltage-controlled switch in accordance with yet another embodiment of the present disclosure.

FIG. 27 is a schematic diagram of a voltage-controlled switch in accordance with yet another embodiment of the present disclosure. As shown in FIG. 27, the voltage-controlled switch 2700 includes a fourteenth transistor T14. According to an embodiment of the present disclosure, the fourteenth transistor T14 is an NPN transistor including a second collector C2, a second base B2, and a second emitter E2. As shown in FIG. 27, the second collector C2 corresponds to the first terminal TM1, the second base B2 corresponds to the control terminal TMC, and the second emitter E2 corresponds to the second terminal TM2.

According to an embodiment of the present disclosure, when the first switch S1 is turned on, the voltage of the internal node NI is coupled to the second base B2 through the parasitic capacitance across the second collector C2 and the second base B2. The voltage of the second base B2 is then clamped by the voltage clamp unit 911 as the clamp voltage VC. The voltage of the third gate terminal G3 of the power switch 320 is equal to the clamp voltage VC minus the cut-off voltage of the fourteenth transistor T14 (i.e., the NPN transistor).

Figure 28:
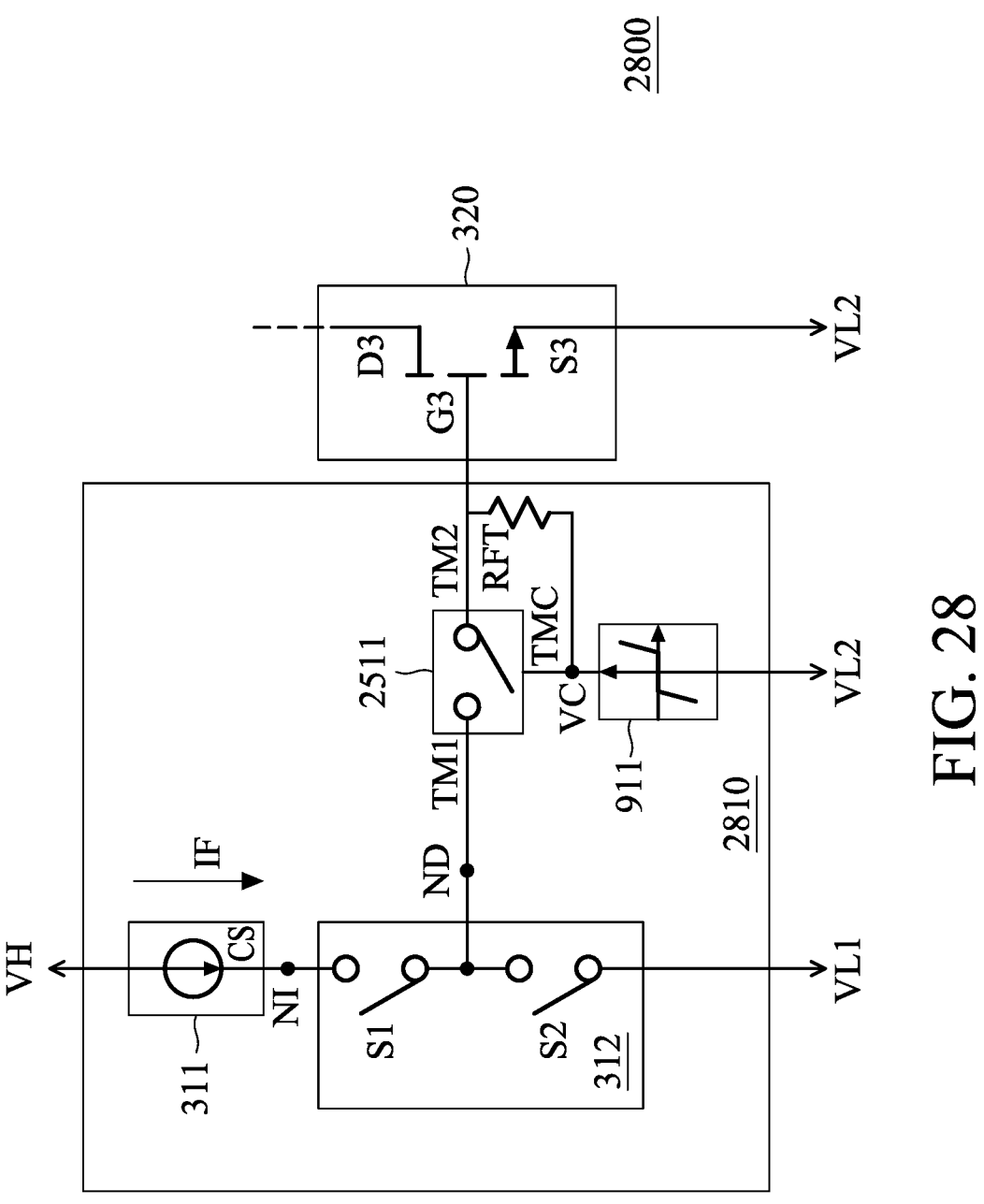
FIG. 28 is a schematic diagram of an electronic circuit in accordance with yet another embodiment of the present disclosure.

FIG. 28 is a schematic diagram of an electronic circuit in accordance with yet another embodiment of the present disclosure. As shown in FIG. 28, the driving circuit 2810 of the electronic circuit 2800 further includes a feedthrough resistor RFT, compared to the electronic circuit 2400 in FIG. 24.

The feedthrough resistor RFT is coupled between the third gate terminal G3 of the power switch 320 and the control terminal TMC. According to some embodiments of the present disclosure, when the first switch S1 is turned on and the voltage-controlled switch 2411 includes the thirteenth transistor T13 in FIG. 26 or the fourteenth transistor T14 in FIG. 27, the voltage of the internal node NI is coupled to the control terminal TMC through the parasitic capacitance across the first terminal TM1 and the control terminal TMC of the voltage-controlled switch 2411, so as to turn on the voltage-controlled switch 2411. Then, the voltage of the internal node NI is provided to the third gate terminal G3 of the power switch 320, and the voltage of the third gate terminal G3 is clamped at a voltage equal to the sum of the voltage across the feedthrough resistor RFT and the clamp voltage VC.

According to other embodiments of the present disclosure, when the first switch S1 is turned on and the voltage-controlled switch 2411 includes the twelfth transistor T12 in FIG. 25, the voltage of the internal node NI is directly provided to the third gate terminal G3 since the twelfth transistor T12 is a normally-on transistor, and the voltage of the third gate terminal G3 of the power switch 320 is clamped at a voltage equal the sum of the voltage across the feedthrough resistor RFT and the clamp voltage VC.

According to some embodiments of the present disclosure, the first control circuit 311, the second control circuit 312, the voltage clamp unit 911, the voltage-controlled switch 2411, and the feedthrough resistor RFT of the driving circuit 2810 may be integrated or packaged together. According to an embodiment of the present disclosure, the first control circuit 311, the second control circuit 312, the voltage clamp unit 911, the voltage-controlled switch 2411, and the feedthrough resistor RFT of the driving circuit 2810 may be integrated using System on Chip (SoC) technology. According to another embodiment of the present disclosure, the first control circuit 311, the second control circuit 312, the voltage clamp unit 911, the voltage-controlled switch 2411, and the feedthrough resistor RFT of the driving circuit 2810 may be packaged using System in Package (SiP) technology. According to another embodiment of the present disclosure, the first control circuit 311, the second control circuit 312, the voltage clamp unit 911, the voltage-controlled switch 2411, and the feedthrough resistor RFT of the driving circuit 2810 may be packaged in 3-dimensional package.

Figure 29:
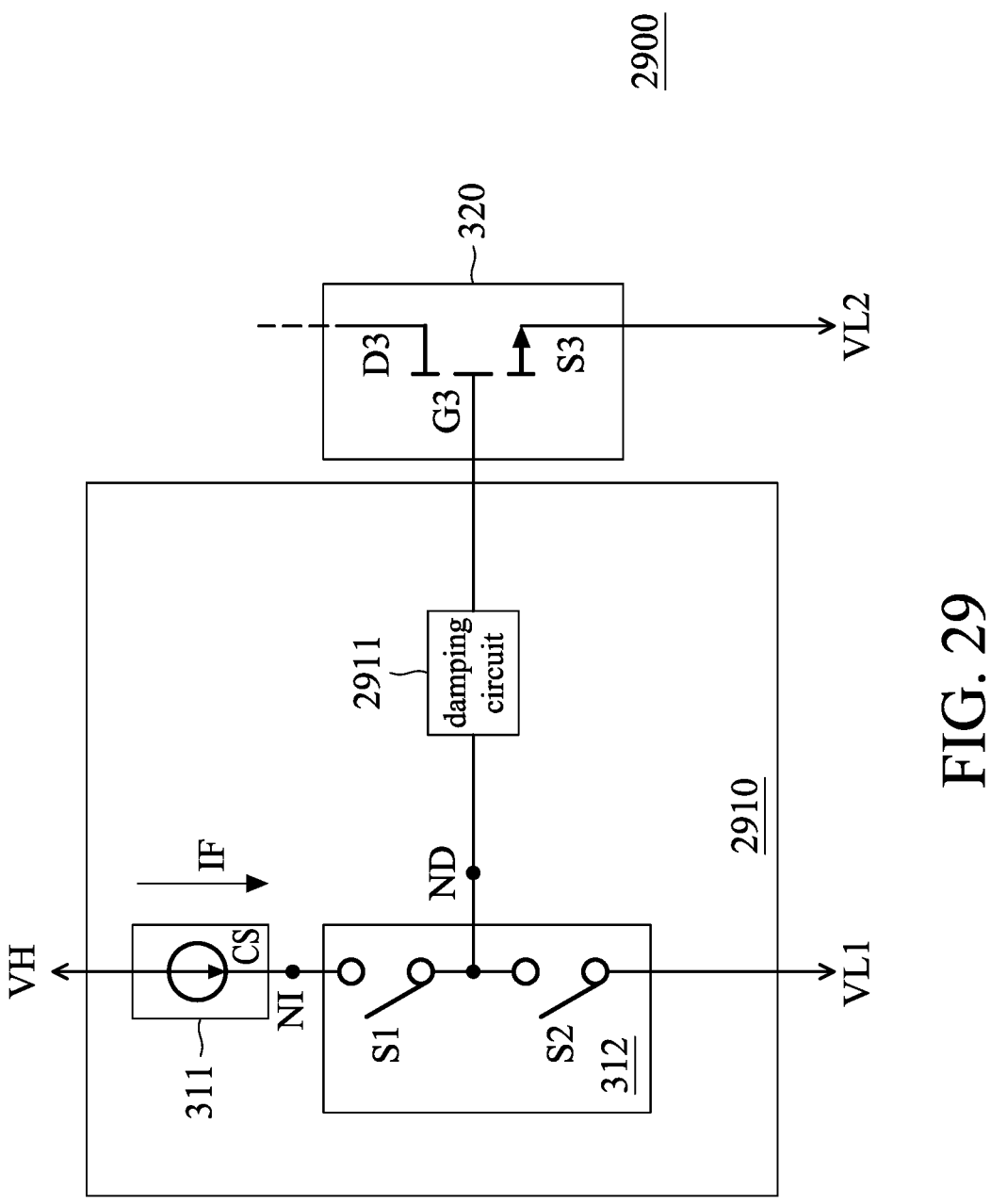
FIG. 29 is a schematic diagram of an electronic circuit in accordance with yet another embodiment of the present disclosure.

FIG. 29 is a schematic diagram of an electronic circuit in accordance with yet another embodiment of the present disclosure. As shown in FIG. 29, the driving circuit 2910 of the electronic circuit 2900 further includes a damping circuit 2911, compared to the electronic circuit 300 in FIG. 3.

The damping circuit 2911 is coupled between the driving node ND and the third gate terminal G3 of the power switch 320, which is configured to prevent oscillation at the third gate terminal G3 of the power switch 320. According to some embodiments of the present disclosure, the oscillation at the third gate terminal G3 of the power switch 320 may result in breaking down the power switch 320.

According to some embodiments of the present disclosure, the driving circuit 2910 may be integrated or packaged together. According to an embodiment of the present disclosure, the first control circuit 311, the second control circuit 312, and the damping circuit 2911 of the driving circuit 2910 may be integrated using System on Chip (SoC) technology. According to another embodiment of the present disclosure, the first control circuit 311, the second control circuit 312, and the damping circuit 2911 of the driving circuit 2910 may be packaged using System in Package (SiP) technology. According to another embodiment of the present disclosure, the first control circuit 311, the second control circuit 312, and the damping circuit 2911 of the driving circuit 2910 may be packaged using 3-dimensional package.

Figure 30:
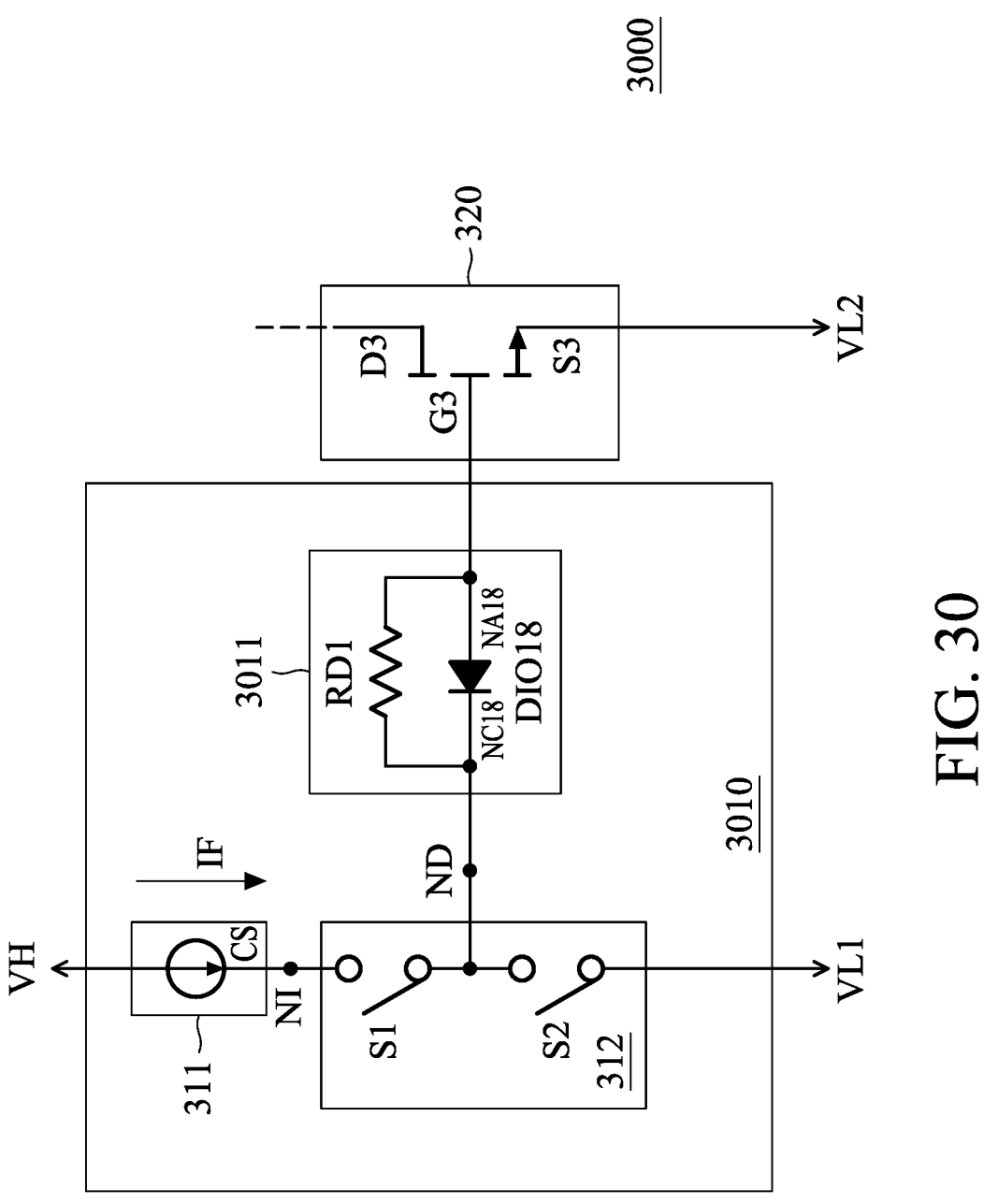
FIG. 30 is a schematic diagram of an electronic circuit in accordance with yet another embodiment of the present disclosure.

FIG. 30 is a schematic diagram of an electronic circuit in accordance with yet another embodiment of the present disclosure. As shown in FIG. 30, the damping circuit 3011 of the driving circuit 3010 of the electronic circuit 3000 includes a first damping resistor R1 and an eighteenth diode DIO18.

The first damping resistor R1 is coupled between the driving node ND and the third gate terminal G3 of the power switch 320. The eighteenth diode DIO18 includes an eighteenth anode NA18 and an eighteenth cathode NC18, where the eighteenth anode NA18 is coupled to the third gate terminal G3 and the eighteenth cathode NC18 is coupled to the driving node ND.

According to an embodiment of the present disclosure, when the first switch S1 is turned on, the voltage of the internal node NI is provided to the third gate terminal G3 through the first switch S1 and the first damping resistor R1 to turn on the power switch 320. According to some embodiments of the present disclosure, the first damping resistor R1 is utilized as a damping factor to prevent oscillation at the third gate terminal G3.

According to another embodiment of the present disclosure, when the first switch S1 is turned off and the second switch S2 is turned on, the voltage of the third gate terminal G3 is discharged through the eighteenth diode DIO18, so as to turn off the power switch 320 in a faster speed. According to some embodiments of the present disclosure, the voltage of the third gate terminal G3 may be discharged through both the eighteenth diode DIO18 and the first damping resistor R1. According to some embodiments of the present disclosure, the voltage of the third gate terminal G3 is discharged down to a voltage equal to the sum of the forward voltage of the eighteenth diode DIO18 and the first low-level voltage VL1.

According to some embodiments of the present disclosure, the first control circuit 311, the second control circuit 312, the first damping resistor R1, and the eighteenth diode DIO18 of the driving circuit 3010 may be integrated or packaged together. According to an embodiment of the present disclosure, the first control circuit 311, the second control circuit 312, the first damping resistor R1, and the eighteenth diode DIO18 of the driving circuit 3010 may be integrated using System on Chip (SoC) technology. According to another embodiment of the present disclosure, the first control circuit 311, the second control circuit 312, the first damping resistor R1, and the eighteenth diode DIO18 of the driving circuit 3010 may be packaged using System in Package (SiP) technology. According to another embodiment of the present disclosure, the first control circuit 311, the second control circuit 312, the first damping resistor R1, and the eighteenth diode DIO18 of the driving circuit 3010 may be packaged in 3-dimensional package.

Figure 31:
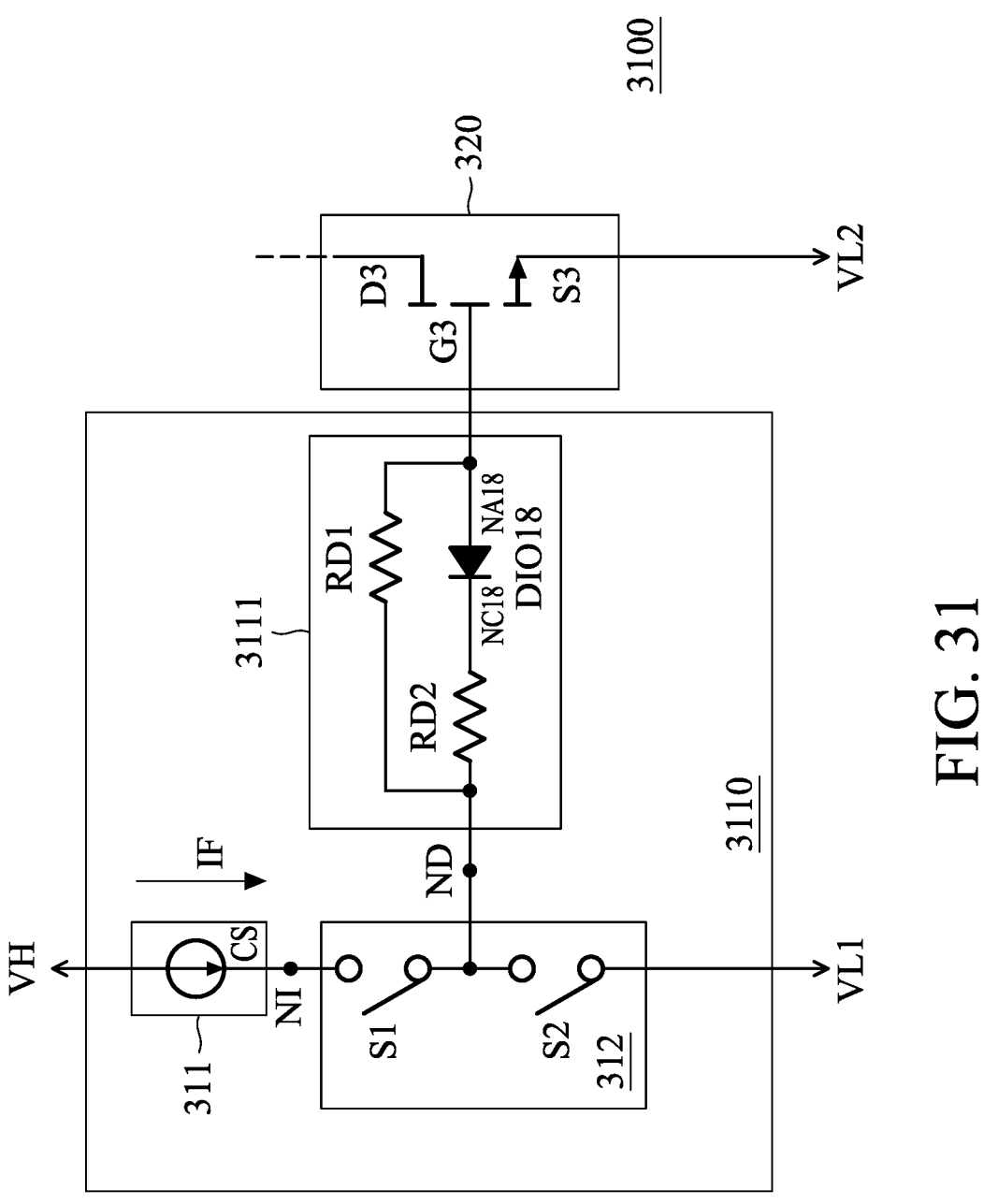
FIG. 31 is a schematic diagram of an electronic circuit in accordance with yet another embodiment of the present disclosure.

FIG. 31 is a schematic diagram of an electronic circuit in accordance with yet another embodiment of the present disclosure. As shown in FIG. 31, the damping circuit 3111 of the driving circuit 3110 of the electronic circuit 3100 further includes a second damping resistor RD2, compared to the damping circuit 3011 in FIG. 30.

The second damping resistor RD2 is coupled between the driving node ND and the eighteenth cathode NC18. According to an embodiment of the preset disclosure, when the first switch S1 is turned on, the voltage of the internal node NI is provided to the third gate terminal G3 through the first switch S1 and the first damping resistor R1 to turn on the power switch 320.

According to another embodiment of the present disclosure, when the first switch S1 is turned off and the second switch S2 is turned on, the voltage of the third gate terminal G3 is discharged through the eighteenth diode DIO18 and the second damping resistor RD2, so as to turn off the power switch 320 in a faster speed. According to some embodiments of the present disclosure, even though the voltage of the third gate terminal G3 may be discharged through both the first damping resistor RD1 and the second damping resistor RD2, the designer may choose the resistance of the second damping resistor RD2 much less than that of the first damping resistor RD1, so that the voltage of the third gate terminal G3 is mainly discharged through the eighteenth diode DIO18 and the second damping resistor RD2.

According to some embodiments of the present disclosure, the first control circuit 311, the second control circuit 312, the first damping resistor R1, the eighteenth diode DIO18, and the second damping resistor R2 of the driving circuit 3110 may be integrated or packaged together. According to an embodiment of the present disclosure, the first control circuit 311, the second control circuit 312, the first damping resistor R1, the eighteenth diode DIO18, and the second damping resistor R2 of the driving circuit 3210 may be integrated using System on Chip (SoC) technology. According to another embodiment of the present disclosure, the first control circuit 311, the second control circuit 312, the first damping resistor R1, the eighteenth diode DIO18, and the second damping resistor R2 of the driving circuit 3110 may be packaged using System in Package (SiP) technology. According to another embodiment of the present disclosure, the first control circuit 311, the second control circuit 312, the first damping resistor R1, the eighteenth diode DIO18, and the second damping resistor R2 of the driving circuit 3110 may be packaged in 3-dimensional package.

Driving circuits that are able to drive a current-driven switch and a voltage-driven switch are proposed herein. The proposed driving circuits are able to set the proper voltage at the gate terminal to keep the voltage-driven switch on, and they also provide a fixed current to keep the current-driven switch on. It makes it really convenient for engineers to be able to freely utilize a current-driven switch or a voltage-driven switch in their designs.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic circuit, comprising:
a driving circuit, comprising:
a first control circuit, coupled between a high-level voltage and an internal node; and
a second control circuit, comprising a first switch and a second switch, wherein the first switch is coupled between the internal node and a driving node, and the second switch is coupled between the driving node and a first low-level voltage, wherein the second control circuit periodically couples the first control circuit and the first low-level voltage to the driving node; and
a power switch, coupled to a second low-level voltage and turned on or off in response to a driving signal at the driving node;
wherein the power switch is either current-driven or voltage-driven;
wherein the first control circuit comprises:
a current source, coupled between the high-level voltage and the internal node and generating a fixed current;
wherein the current source comprises:
a first resistor, coupled between the high-level voltage and a first node and generating a first current;
a reference generator, generating a reference voltage at a second node based on the first current;
a second resistor, coupled between the second node and the internal node and generating a second current with the reference voltage; and
an NPN transistor, comprising a collector, a base, and an emitter, wherein the collector is coupled to the high-level voltage, the base is coupled to the first node, and the emitter is coupled to the second node;
wherein the fixed current is equal to a sum of the first current and the second current.

2. The electronic circuit as defined in claim 1, wherein the first low-level voltage is equal to the second low-level voltage.

3. The electronic circuit as defined in claim 1, wherein the first low-level voltage is not equal to the second low-level voltage.

4. An electronic circuit, comprising:
a driving circuit, comprising:
a first control circuit, coupled between a high-level voltage and an internal node; and
a second control circuit, comprising a first switch and a second switch, wherein the first switch is coupled between the internal node and a driving node, and the second switch is coupled between the driving node and a first low-level voltage, wherein the second control circuit periodically couples the first control circuit and the first low-level voltage to a driving node; and
a power switch, coupled to a second low-level voltage and turned on or off in response to a driving signal at the driving node;
wherein the power switch is either current-driven or voltage-driven;
wherein the first control circuit comprises:
a current source, coupled between the high-level voltage and the internal node and generating a fixed current;
wherein the current source comprises:
a normally-on transistor, comprising a drain terminal, a gate terminal, and a source terminal, wherein the drain terminal is coupled to the high-level voltage and the gate terminal is coupled to the internal node; and
a first resistor, coupled between the source terminal and the internal node;
wherein the fixed current is generated based on the first resistor and a voltage across the source terminal and the gate terminal.

5. The electronic circuit as defined in claim 1, wherein the first control circuit further comprises:
a capacitor, coupled between the high-level voltage and the internal node.

6. An electronic circuit, comprising:
a driving circuit, comprising:
a first control circuit, coupled between a high-level voltage and an internal node; and
a second control circuit, comprising a first switch and a second switch, wherein the first switch is coupled between the internal node and a driving node, and the second switch is coupled between the driving node and a first low-level voltage, wherein the second control circuit periodically couples the first control circuit and the first low-level voltage to a driving node; and
a power switch, coupled to a second low-level voltage and turned on or off in response to a driving signal at the driving node;
wherein the power switch is either current-driven or voltage-driven;
wherein the first control circuit comprises:
a current source, coupled between the high-level voltage and the internal node and generating a fixed current;
wherein the first control circuit further comprises:
a diode, comprising an anode and a cathode, wherein the anode is coupled to the internal node and the cathode is coupled to the high-level voltage.

7. The electronic circuit as defined in claim 1, wherein the driving circuit further comprises:
a dividing circuit, comprising:
a first dividing resistor, coupled between the high-level voltage and the internal node; and
a second dividing resistor, coupled between the driving node and the second low-level voltage;
wherein the dividing circuit is configured to determine a voltage of the driving node.

8. The electronic circuit as defined in claim 1, wherein the driving circuit further comprises:
a voltage clamp unit, coupled between the driving node and the second low-level voltage;
wherein the voltage clamp unit is configured to clamp a voltage between the driving node and the second low-level voltage.

9. The electronic circuit as defined in claim 8, wherein the voltage clamp unit comprises:
a Zener diode, comprising a anode and a cathode;
wherein the anode is coupled to the second low-level voltage, and the cathode is coupled to the driving node.

10. The electronic circuit as defined in claim 8, wherein the voltage clamp unit comprises:
a Zener diode, comprising a anode and a cathode;
wherein the anode is coupled to the driving node, and the cathode is coupled to the second low-level voltage.

11. The electronic circuit as defined in claim 8, wherein the voltage clamp unit comprises:
a first Zener diode, comprising a first anode and a first cathode; and
a second Zener diode, comprising a second anode and a second cathode;
wherein the first anode is coupled to the second anode;

wherein the first cathode is coupled to the driving node;

wherein the second cathode is coupled to the second low-level voltage.

12. The electronic circuit as defined in claim 8, wherein the voltage clamp unit comprises:

a diode, comprising a first anode and a first cathode; and a Zener diode, comprising a second anode and a second cathode;

wherein the first anode is coupled to the driving node;

wherein the first cathode is coupled to the second cathode;

wherein the second anode is coupled to the second low-level voltage.

13. The electronic circuit as defined in claim 8, wherein the voltage clamp unit comprises:

a Zener diode, comprising a first anode and a first cathode; and a diode, comprising a second anode and a second cathode;

wherein the first anode is coupled to the driving node;

wherein the first cathode is coupled to the second cathode;

wherein the second anode is coupled to the second low-level voltage.

14. The electronic circuit as defined in claim 8, wherein the voltage clamp unit comprises:

a first diode, comprising a first anode and a first cathode;

a second diode, comprising a second anode and a second cathode; and a third diode, comprising a third anode and a third cathode;

wherein the first anode is coupled to the driving node;

wherein the first cathode is coupled to the second anode;

wherein the second cathode is coupled to the second low-level voltage;

wherein the third anode is coupled to the second low-level voltage;

wherein the third cathode is coupled to the driving node.

15. The electronic circuit as defined in claim 8, wherein the voltage clamp unit comprises:

a first diode, comprising a first anode and a first cathode;

wherein the first anode is coupled to the second low-level voltage;

wherein the first cathode is coupled to the driving node.

16. The electronic circuit as defined in claim 8, wherein the voltage clamp unit comprises:

a first diode, comprising a first anode and a first cathode;

wherein the first anode is coupled to the driving node;

wherein the first cathode is coupled to the second low-level voltage.

17. The electronic circuit as defined in claim 8, wherein the voltage clamp unit comprises:

a first diode, comprising a first anode and a first cathode; and a second diode, comprising a second anode and a second cathode;

wherein the first anode is coupled to the second low-level voltage;

wherein the first cathode is coupled to the driving node;

wherein the second anode is coupled to the driving node;

wherein the second cathode is coupled to the second low-level voltage.

18. The electronic circuit as defined in claim 8, wherein the voltage clamp unit comprises:

a first N-type transistor, comprising a first drain terminal, a first gate terminal, a first source terminal, and a first base terminal;

a second N-type transistor, comprising a second drain terminal, a second gate terminal, a second source terminal, and a second base terminal; and a third N-type transistor, comprising a third drain terminal, a third gate terminal, a third source terminal, and a third base terminal;

wherein the first source terminal is coupled to the first gate terminal, the first base terminal, the driving node, and the third drain terminal;

wherein the first drain terminal is coupled to the second source terminal, the second gate terminal, and the second base terminal;

wherein the second drain terminal is coupled to the second low-level voltage, the third source terminal, the third gate terminal, and the third base terminal.

19. The electronic circuit as defined in claim 8, wherein the voltage clamp unit comprises:

a first N-type transistor, comprising a first drain terminal, a first gate terminal, a first source terminal, and a first base terminal;

wherein the first source terminal is coupled to the first gate terminal, the first base terminal, and the second low-level voltage;

wherein the first drain terminal is coupled to the driving node.

20. The electronic circuit as defined in claim 8, wherein the voltage clamp unit comprises:

a first N-type transistor, comprising a first drain terminal, a first gate terminal, a first source terminal, and a first base terminal;

wherein the first source terminal is coupled to the first gate terminal, the first base terminal, and the driving node;

wherein the first drain terminal is coupled to the second low-level voltage.

21. The electronic circuit as defined in claim 8, wherein the driving circuit further comprises:

a voltage-controlled switch, comprising a first terminal, a second terminal, and a control terminal;

wherein the first terminal is coupled to the driving node;

wherein the second terminal is coupled to a gate terminal of the power switch;

wherein the voltage clamp unit is coupled between the control node and the second low-level voltage.

22. The electronic circuit as defined in claim 21, wherein when the first switch is turned on, the high-level voltage is provided to the control terminal of the voltage-controlled switch through a parasitic capacitance between the first terminal and the control terminal;

wherein the voltage-controlled switch is turned on or off in response to a voltage of the control terminal.

23. The electronic circuit as defined in claim 21, wherein the voltage-controlled switch comprises:

a normally-on transistor, comprising the first terminal, the second terminal, and the control terminal;

wherein when a voltage of the control terminal to the second terminal is less than a threshold of the normally-on transistor, the normally-on transistor is turned off so as to set a voltage of the gate terminal of the power switch;

wherein a voltage of the control terminal is determined by the voltage clamp unit.

24. The electronic circuit as defined in claim 21, wherein the voltage-controlled switch comprises:

a normally-off transistor, comprising the first terminal, the second terminal, and the control terminal;

wherein when a voltage of the control terminal to the second terminal is less than a threshold of the normally-off transistor, the normally-off transistor is turned off so as to set a voltage of the gate terminal of the power switch;

wherein a voltage of the control terminal is determined by the voltage clamp unit.

25. The electronic circuit as defined in claim 21, wherein the voltage-controlled switch comprises:

an NPN transistor, comprising a collector, a base, and an emitter;

wherein the collector corresponds to the first terminal, the base corresponds to the control terminal, and the emitter corresponds to the second terminal;

wherein when a voltage of the base to the emitter is less than a cut-off voltage of the NPN transistor, the NPN transistor is turned off so as to set a voltage of the gate terminal of the power switch;

wherein a voltage of the control terminal is determined by the voltage clamp unit.

26. The electronic circuit as defined in claim 21, wherein the voltage-controlled circuit comprises:

a feedthrough resistor, coupled between the gate terminal of the power switch and the control terminal.

27. The electronic circuit as defined in claim 26, wherein a voltage of the gate terminal of the power switch is equal to a sum of a voltage across the feedthrough resistor and a voltage of the control terminal.

28. The electronic circuit as defined in claim 8, wherein the driving circuit further comprises:

a damping circuit, coupled between the driving node and a gate terminal of the power switch;

wherein the damping circuit is configured to prevent oscillation at the gate terminal of the power switch.

29. The electronic circuit as defined in claim 28, wherein the damping circuit comprises:

a first damping resistor, coupled between the driving node and the gate terminal of the power switch; and a diode, comprising an anode and a cathode, wherein the anode is coupled to the gate terminal of the power switch and the cathode is coupled to the driving node.

30. The electronic circuit as defined in claim 29, wherein the damping circuit comprises:

a second damping resistor, coupled between the cathode and the driving node.

* * * * *